United States Patent
Moon

(10) Patent No.: US 9,208,867 B2
(45) Date of Patent: Dec. 8, 2015

(54) ELECTRONIC DEVICE AND METHOD FOR FABRICATING THE SAME

(71) Applicant: SK hynix Inc., Icheon-Si (KR)

(72) Inventor: Joo-Young Moon, Icheon-Si (KR)

(73) Assignee: SK hynix Inc., Icheon-Si (KR)

(*) Notice: Subject to any disclaimer, the term of this patent is extended or adjusted under 35 U.S.C. 154(b) by 127 days.

(21) Appl. No.: 14/197,980

(22) Filed: Mar. 5, 2014

(65) Prior Publication Data

US 2014/0254243 A1    Sep. 11, 2014

(30) Foreign Application Priority Data

Mar. 6, 2013    (KR) .................. 10-2013-0023883

(51) Int. Cl.
- G11C 13/00 (2006.01)
- H01L 45/00 (2006.01)
- H01L 27/22 (2006.01)
- H01L 27/24 (2006.01)

(52) U.S. Cl.
CPC .......... *G11C 13/0002* (2013.01); *H01L 27/222* (2013.01); *H01L 27/2481* (2013.01); *H01L 45/04* (2013.01); *H01L 45/06* (2013.01); *H01L 45/1233* (2013.01); *H01L 45/141* (2013.01); *H01L 45/147* (2013.01); *H01L 45/16* (2013.01); *G11C 13/0004* (2013.01)

(58) Field of Classification Search
CPC .......... G11C 13/0004; G11C 13/0069; G11C 11/5678; G11C 2213/79; G11C 13/004
USPC ................. 365/163, 51, 185.18, 50, 130, 173
See application file for complete search history.

(56) References Cited

U.S. PATENT DOCUMENTS

2005/0087785 A1    4/2005 Lu
2012/0039130 A1*   2/2012 Yoon .................. G11C 16/0483
                                                  365/185.18

FOREIGN PATENT DOCUMENTS

| KR | 10-0979351 B1 | 8/2010 |
| KR | 10-1095745 B1 | 12/2011 |
| KR | 10-2012-0126659 | 11/2012 |

* cited by examiner

Primary Examiner — Jason Lappas
(74) Attorney, Agent, or Firm — Perkins Coie LLP

(57) ABSTRACT

A semiconductor memory includes a substrate configured to include a plurality of active regions which are defined by isolation layers extending in a first direction and word lines extending in a second direction intersecting the first direction; source line contacts configured to be alternately disposed over the active regions arranged in the first and second directions and disposed over each of the active regions arranged in a third direction intersecting the first and second directions; source lines configured to extend in the third direction while being coupled to the source line contacts; contacts configured to be disposed over each of the active regions over which the source line contacts are not disposed; variable resistance elements configured to be disposed over each of the contacts; bit line contacts configured to be disposed over each of the variable resistance elements; and bit lines configured to extend in a fourth direction intersecting the first to third directions while being coupled to the bit line contacts.

20 Claims, 30 Drawing Sheets

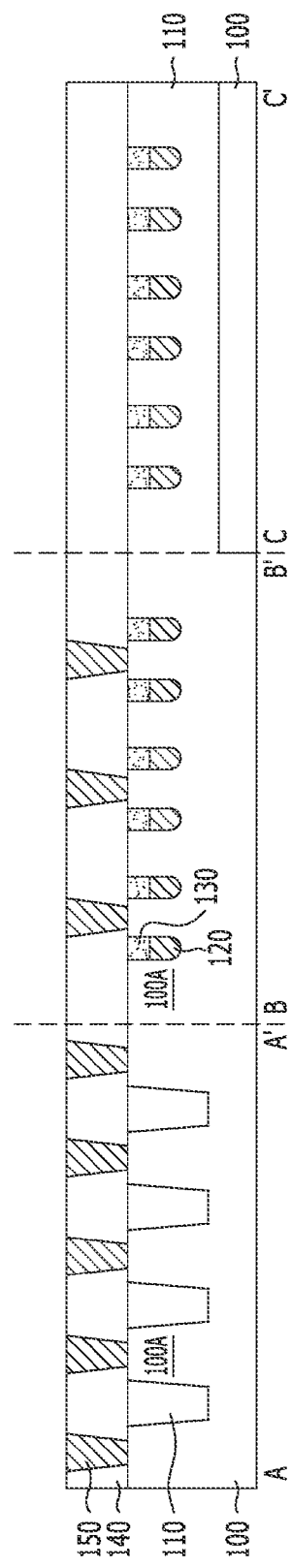

ELECTRONIC DEVICE AND METHOD FOR FABRICATING THE SAME

CROSS-REFERENCE TO RELATED APPLICATIONS

The present application claims priority of Korean Patent Application No. 10-2013-0023883, entitled "SEMICONDUCTOR DEVICE AND METHOD FOR FABRICATING THE SAME, AND MICRO PROCESSOR, PROCESSOR, SYSTEM, DATA STORAGE SYSTEM AND MEMORY SYSTEM INCLUDING THE SEMICONDUCTOR DEVICE," and filed on Mar. 6, 2013, which is incorporated herein by reference in its entirety.

BACKGROUND

This patent document relates to memory circuits or devices and their applications in electronic devices or systems.

Recently, as electronic devices or appliances trend toward miniaturization, low power consumption, high performance, multi-functionality, and so on, there is a demand for semiconductor devices capable of storing information in various electronic devices or appliances such as a computer, a portable communication device, and so on, and research and development for such semiconductor and related electronic devices have been conducted. Examples of such semiconductor devices include semiconductor devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes electronic devices and a method for fabricating the same in which required integration is satisfied, a process is simple, and reliability of devices is improved.

In one aspect, an electronic device including a semiconductor memory is provided and the semiconductor memory includes: a substrate configured to include a plurality of active regions which are defined by isolation layers extending in a first direction and word lines extending in a second direction intersecting the first direction; source line contacts configured to be alternately disposed over the active regions arranged in the first and second directions and disposed over each of the active regions arranged in a third direction intersecting the first and second directions; source lines configured to extend in the third direction while being coupled to the source line contacts; contacts configured to be disposed over each of the active regions over which the source line contacts are not disposed; variable resistance elements configured to be disposed over each of the contacts; bit line contacts configured to be disposed over each of the variable resistance elements; and bit lines configured to extend in a fourth direction intersecting the first to third directions while being coupled to the bit line contacts.

In one aspect, an electronic device including a semiconductor memory is provided and the semiconductor memory includes: a substrate including a plurality of active regions which are defined by the isolation layers extending in a first direction, and word lines extending in a second direction intersecting the first direction; source line contacts disposed over every other of the active regions arranged in the first and second directions and disposed over each of the active regions arranged in a third direction intersecting the first and second directions; source lines extending in the third direction and being coupled to the source line contacts; contacts disposed over the active regions over which the source line contacts are not disposed; variable resistance elements disposed over and coupled to the contacts, respectively; bit line contacts disposed over and coupled to the variable resistance elements; and bit lines extending in a fourth direction intersecting the first to third directions and be coupled to the bit line contacts.

In some implementations, the word line is buried in the substrate.

In some implementations, a height of a source line is equal to or less than that of a contact.

In some implementations, the contacts include first to N-th contacts (N is a natural number of 2 or more) which are sequentially arranged repeatedly in the fourth direction and heights of each of the first to N-th contacts are different from each other. In some implementations, the bit line contacts include first to N-th bit line contacts which overlap each of the first to N-th contacts and upper heights of the first to N-th bit line contacts are the same and lower heights thereof are different from each other.

In some implementations, the contacts include groups of contacts formed at different heights from the substrate and in the fourth direction. In some implementations, the bit line contacts include groups of bit line contacts which overlap the groups of contacts, respectively, and upper heights of the groups of bit line contacts are the same.

In some implementations, the variable resistance element includes a ferromagnetic material, a ferroelectric material, a phase change material, or a metal oxide.

In some implementations, the first direction and the second direction are substantially perpendicular to each other, the third direction and the fourth direction are substantially perpendicular to each other, and an angle formed by one of the first and second directions and one of the third and fourth directions is approximately 45°.

In another aspect, a method is provided for fabricating an electronic device including a semiconductor memory. The method includes: providing a substrate including a plurality of active regions which are defined by isolation layers extending in a first direction and word lines extending in a second direction intersecting the first direction; forming source line contacts alternately disposed over the active regions arranged in the first and second directions and disposed over each of the active regions arranged in a third direction intersecting the first and second directions; forming source lines extending in the third direction while being coupled to the source line contacts over the source line contacts; forming contacts disposed over each of the active regions over which the source line contacts are not disposed; forming variable resistance elements over each of the contacts; forming bit line contacts over each of the variable resistance elements; and forming bit lines extending in a fourth direction intersecting the first to third directions while being coupled to the bit line contacts over the bit line contacts.

In another aspect, a method is provided for fabricating an electronic device including a semiconductor memory. The method includes: providing a substrate including a plurality of active regions which are defined by isolation layers extending in a first direction and word lines extending in a second direction intersecting the first direction; forming source line contacts alternately disposed over the active regions arranged in the first and second directions and disposed over the active regions arranged in a third direction intersecting the first and second directions; forming source lines extending in the third direction and being coupled to the source line contacts; forming contacts disposed over the active regions at locations where the source line contacts are not disposed; forming variable resistance elements over the contacts so that the variable resistance elements are coupled to the contacts, respectively; forming bit line contacts to contact with the variable resistance elements; and forming bit lines extending in a fourth direction intersecting the first to third directions and being coupled to the bit line contacts.

In another aspect, a method is provided for fabricating an electronic device including a semiconductor memory and the method includes: providing a substrate including a plurality of active regions which are defined by isolation layers extending in a first direction and word lines extending in a second direction intersecting the first direction; forming source line contacts over each of the active regions which is disposed between a pair of word lines; forming source lines extending in the second direction over the source line contacts; forming contacts over each of the active regions disposed between adjacent word lines while belonging to different pairs; forming variable resistance elements over each of the contacts; forming bit line contacts over each of the variable resistance elements; and forming bit lines extending in the first direction over the bit line contacts.

In another aspect, a method for fabricating an electronic device including a semiconductor memory is provided. The method includes: providing a substrate including a plurality of active regions which are defined by isolation layers extending in a first direction and word lines extending in a second direction intersecting the first direction; forming source line contacts over the active regions between a pair of word lines; forming source lines extending in the second direction over the source line contacts; forming contacts over the active regions disposed between adjacent word lines while belonging to different pairs; forming variable resistance elements to be connected to the contacts, respectively; forming bit line contacts over the variable resistance element; and forming bit lines extending in the first direction and connected to the bit line contacts.

In some implementations, the word lines are formed by forming trenches for forming the word lines by selectively etching the substrate in which the isolation layers are formed and burying lower portions of the trenches with a conductive material. In some implementations, the word lines are formed by forming trenches by selectively etching the substrate and burying lower portions of the trenches with a conductive material.

In some implementations, the forming of the contacts is performed such that the contacts penetrate through interlayer dielectrics.

In some implementations, the forming of the contacts includes forming first to N-th contacts (N is a natural number of 2 or more) which are sequentially arranged repeatedly in the fourth direction, and heights of each of the first to N-th contacts are different from each other.

In some implementations, the forming of the contacts includes forming groups of contacts at different heights in the fourth direction.

In some implementations, the forming of the bit line contacts includes forming first to N-th bit line contacts which overlap each of the first to N-th contacts, and upper heights of the first to N-th bit line contacts are the same and lower heights thereof are different from each other. In some implementations, the forming of the bit lien line contacts includes forming groups of bit line contacts which overlap groups of contacts, respectively, and upper heights of the groups of bit line contacts are the same.

In some implementations, the forming of the variable resistance elements includes forming a material layer including a ferromagnetic material, a ferroelectric material, a phase change material, or a metal oxide, and selectively etching the material layer.

In another aspect, an electronic device including a semiconductor memory is provided and the semiconductor memory includes: a substrate configured to include a plurality of active regions which are defined by isolation layers extending in a first direction and word lines extending in a second direction intersecting the first direction; source line contacts configured to be disposed over each of the active regions which is disposed between a pair of word lines; source lines configured to be disposed over the source line contacts and extend in the second direction; contacts configured to be disposed over each of the active regions disposed between adjacent word lines while belonging to different pairs; variable resistance elements configured to be disposed over each of the contacts; bit line contacts configured to be disposed over each of the variable resistance elements; and bit lines configured to be disposed over the bit line contacts and extend in the first direction.

In another aspect, an electronic device including a semiconductor memory is provided and the semiconductor memory includes: a substrate including a plurality of active regions which are defined by isolation layers extending in a first direction and word lines extending in a second direction intersecting the first direction; source line contacts disposed over the active regions and between a pair of word lines located on two sides of a source line contact; source lines coupled to the source line contacts and extend in the second direction; contacts disposed over the active regions and between two adjacent word lines of two different pairs of word lines; variable resistance elements disposed over, and coupled to, the contacts, respectively; bit line contacts disposed over and coupled to the variable resistance elements; and bit lines disposed over and coupled to the bit line contacts and extend in the first direction.

In another aspect, an electronic device including a semiconductor memory is provided and the semiconductor memory includes: a substrate configured to include a plurality of active regions which are defined by isolation layers extending in a first direction and word lines extending in a second direction intersecting the first direction; source line contacts configured to be alternately disposed over the active regions arranged in the first and second directions and disposed over each of the active regions arranged in a fourth direction intersecting the first and second directions; variable resistance elements configured to be disposed over each of the contacts; bit line contacts configured to be disposed over each of the variable resistance elements; and bit lines configured to extend in the fourth direction while being coupled to the bit line contacts.

In another aspect, an electronic device including a semiconductor memory is provided and the semiconductor memory includes: a substrate configured to include a plurality of active regions which are defined by isolation layers extending in a first direction and word lines extending in a second direction intersecting the first direction; contacts configured to be disposed over each of the active regions which is disposed between a pair of word lines; variable resistance elements configured to be disposed over each of the contacts; bit line contacts configured to be disposed over each of the variable resistance elements; and bit lines configured to be disposed over the bit line contacts and extend in the first direction.

In some implementations, the word line is buried in the substrate.

In some implementations, a height of a source line is equal to or less than that of a contact.

In some implementations, the contacts include first to N-th contacts (N is a natural number of 2 or more) which are sequentially arranged repeatedly in the second direction and heights of each of the first to N-th contacts are different from each other. In some implementations, the contacts include groups of contacts formed at different heights in the second direction.

In some implementations, the bit line contacts include first to N-th bit line contacts which overlap each of the first to N-th contacts and upper heights of the first to N-th bit lines are the same and lower heights thereof are different from each other. In some implementations, the bit line contacts include groups of bit line contacts which overlap the groups of contacts, respectively, and upper heights of the groups of bit lines are the same.

In some implementations, the variable resistance element includes a ferromagnetic material, a ferroelectric material, a phase change material, or a metal oxide.

In another aspect, an electronic device may include a semiconductor memory, wherein the semiconductor memory includes: a substrate configured to include a plurality of active regions which are defined by isolation layers extending in a first direction and word lines extending in a second direction intersecting the first direction; contacts configured to be disposed over each of the active regions which is disposed between a pair of word lines; variable resistance elements configured to be disposed over each of the contacts; bit line contacts configured to be disposed over each of the variable resistance elements; and bit lines configured to be disposed over the bit line contacts and extend in the first direction.

In another aspect, an electronic device including a semiconductor memory is provided and the semiconductor memory includes: a substrate patterned to include isolation layers and active regions separated by the isolation layers; word lines connected with the active regions; first contacts formed over the active regions; source lines connected to the first contacts; second contacts formed over the active regions and separated from the first contacts; variable resistance elements connected to the second contacts; third contacts formed over the active regions and separated from the first and second contacts; and bit lines connected to the third contacts, wherein the word lines, the source lines, the variable resistance elements and the bit lines are formed at different heights from one another, and the first contacts, the second contacts, and the third contacts are alternately arranged in a first direction or a second direction.

In yet another aspect, an electronic device including a semiconductor memory is provided and the semiconductor memory includes: a substrate patterned to include isolation layers and active regions separated by the isolation layers; word lines cross the active regions; first contacts formed over the active regions; source lines coupled to the first contacts; second contacts formed over the active regions and separated from the first contacts; variable resistance elements coupled to the second contacts; third contacts coupled to the variable resistance elements; and bit lines coupled to the third contacts, wherein the word lines, the source lines, the variable resistance elements and the bit lines are formed at different heights from one another, and the first contacts and the second contacts are alternately arranged in a first direction or a second direction.

In some implementations, the first contacts and the second contacts are formed in different portions of the active regions that do not overlap from one another. In some implementations, the first direction and the second direction are parallel or intersect to each other. In some implementations, the isolation layers, word lines, source lines, and bit lines intersect. In some implementations, the variable resistance elements include groups of variable resistance elements, each group having different heights from other groups of variable resistance elements. In some implementations, the second contacts include groups of second contacts, each group of second contacts having different height from other groups of second contacts.

In some implementations, the electronic devices may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

In some implementations, the electronic devices may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

In some implementations, the electronic devices may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

In some implementations, the electronic devices may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

In some implementations, the electronic devices may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

These and other aspects, implementations and associated advantages are described in greater detail in the drawings, the description and the claims.

DETAILED DESCRIPTION

Figure 1A:
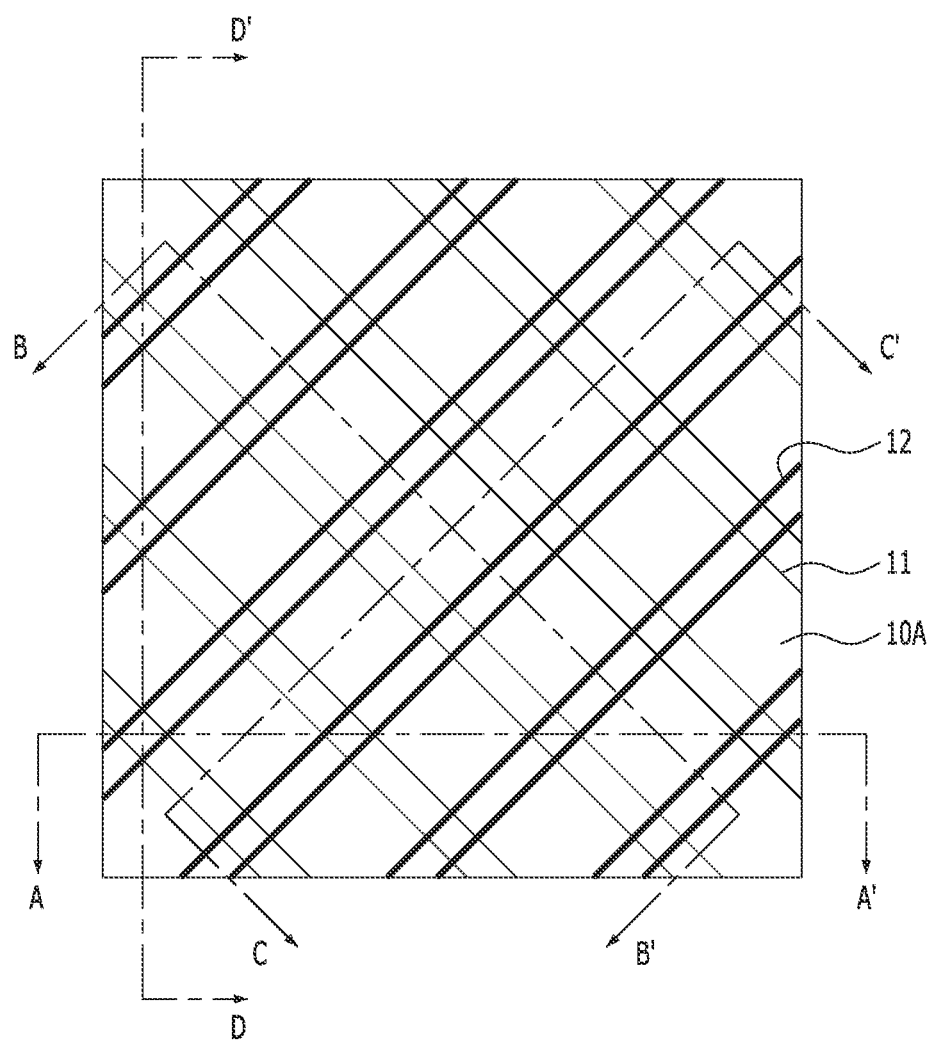
FIGS. 1A to 6B are diagrams for explaining an example of a method for fabricating a semiconductor device in accordance with one implementation of the disclosed technology.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 4A:
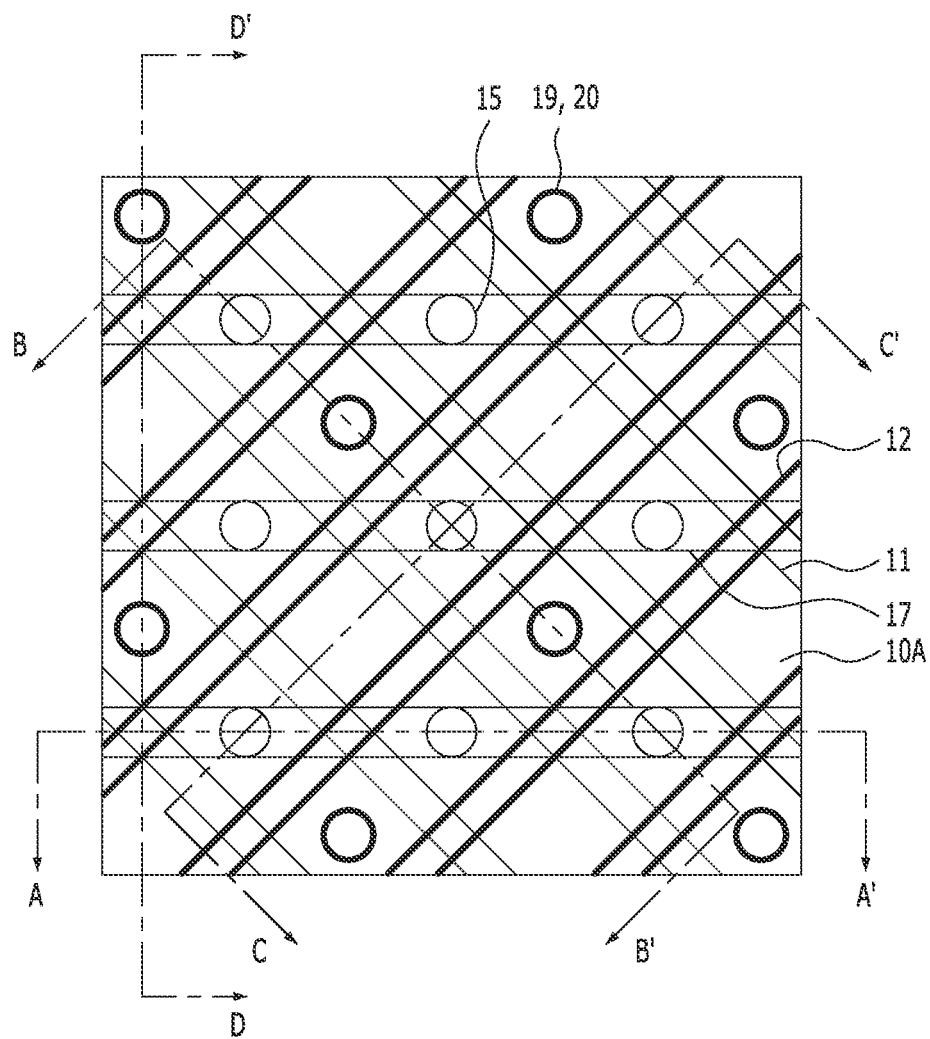
Figure 4B:
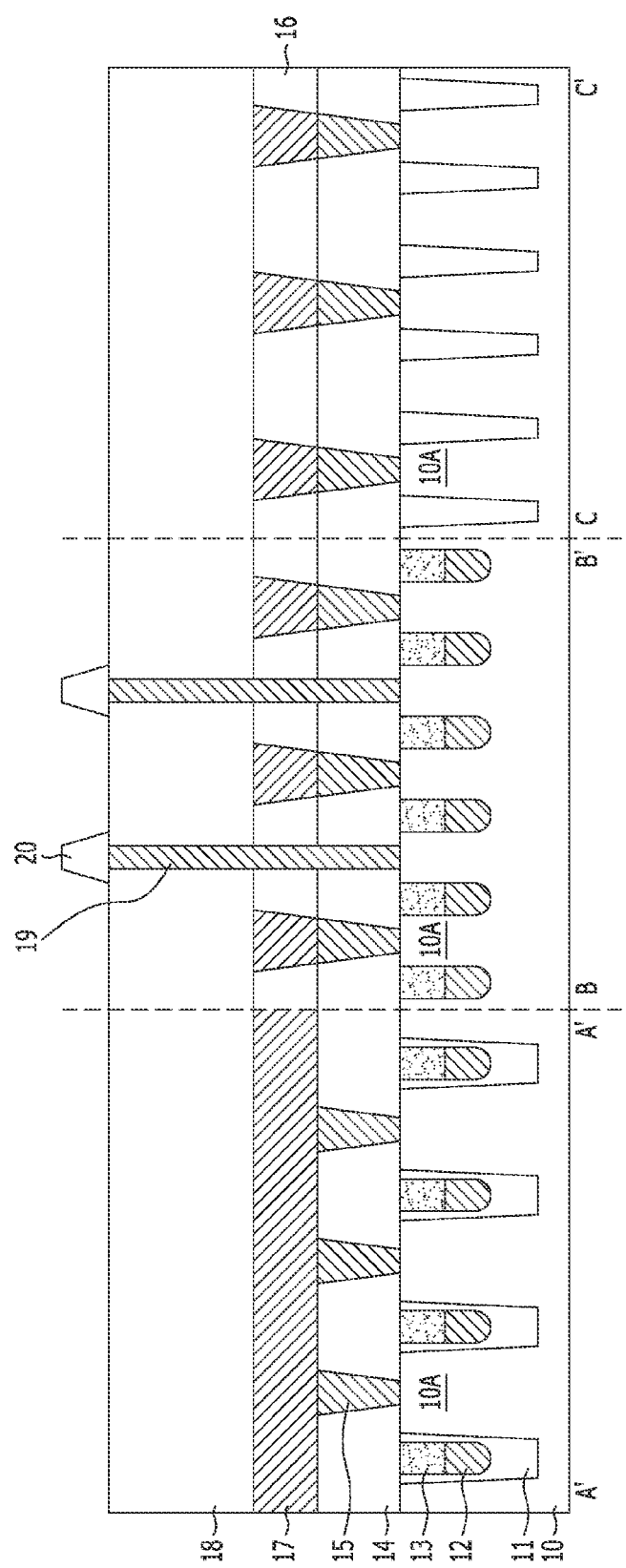
Figure 5A:
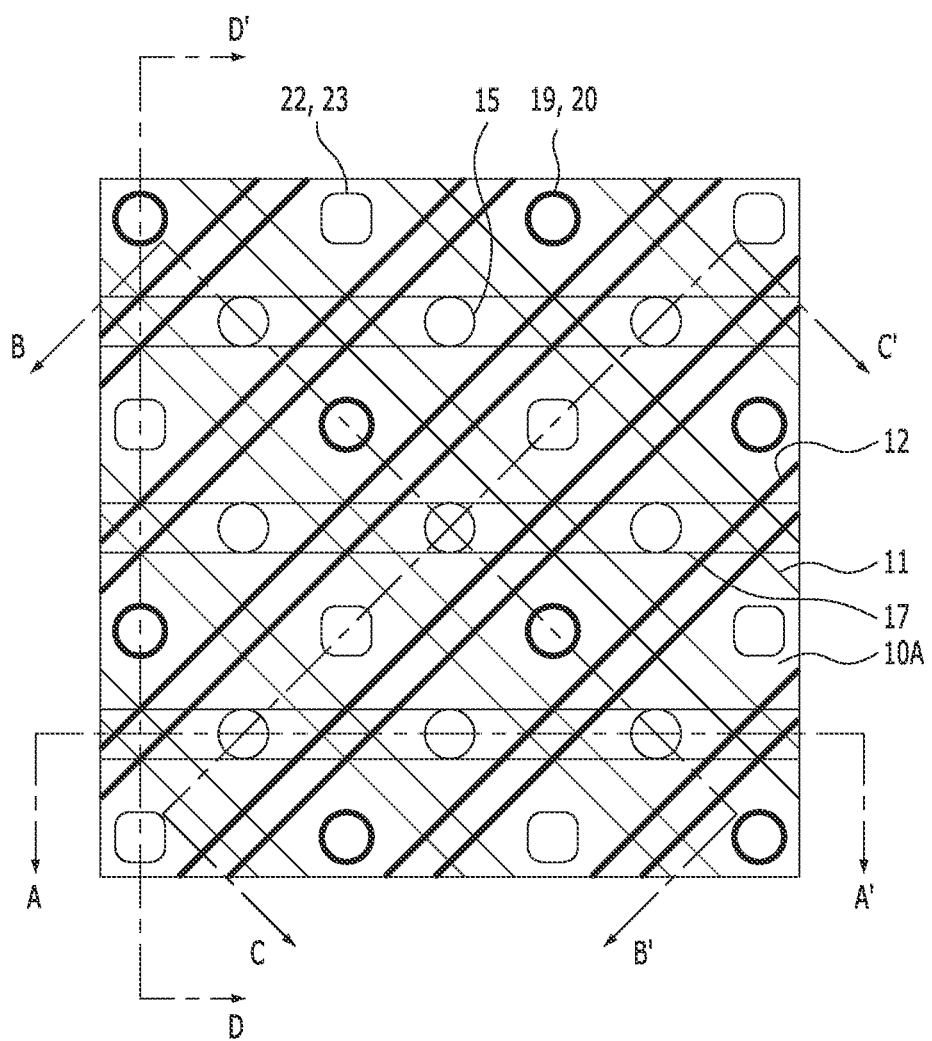
Figure 5B:
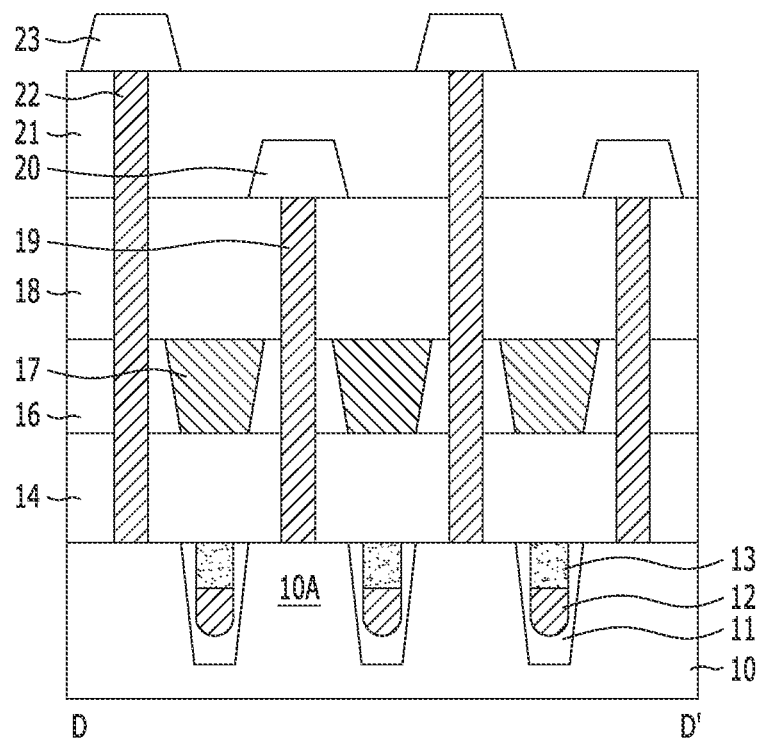
Figure 6A:
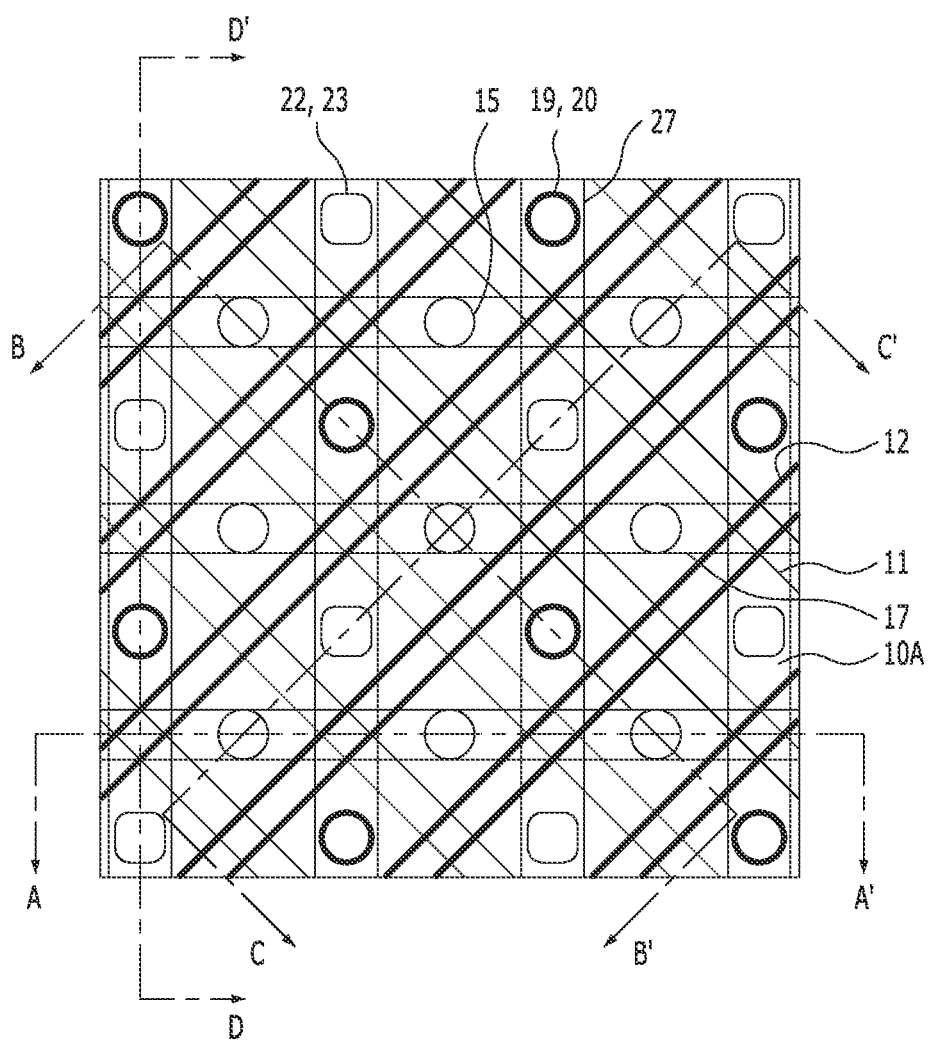
Figure 6B:
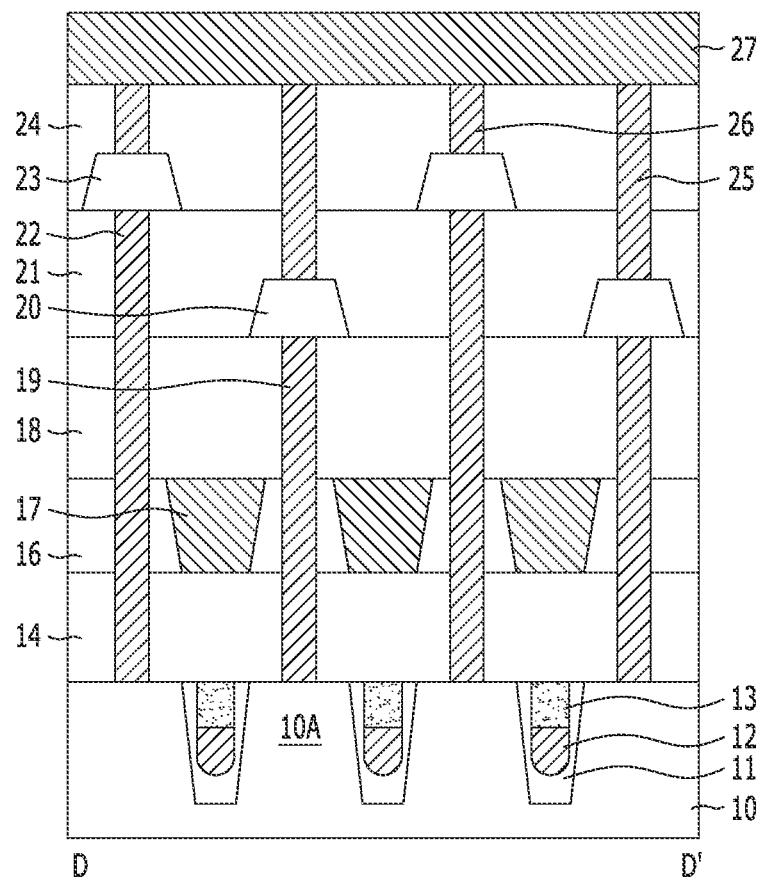

FIGS. 1A to 6B are diagrams for explaining an example of a method for fabricating a semiconductor device in one implementation of the disclosed technology. In numbering drawings, the suffix "A" illustrates plan views, suffix "B" illustrates cross-sectional views taken along predetermined lines of the corresponding plan views. FIGS. 6A and 6B illustrate the structure of the device and FIGS. 1A to 5B illustrate an example of a process for fabricating the device illustrated in FIGS. 6A and 6B.

Figure 1B:
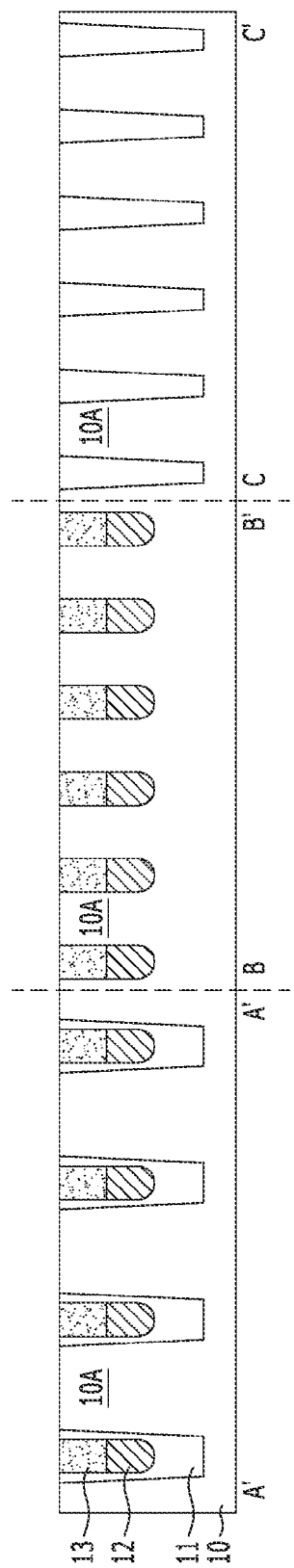

Referring to FIGS. 1A to 1B, isolation layers 11 are formed in a substrate 10. The isolation layer 11 may have a line shape which extends in a first direction (see the line B-B'). The isolation layer 11 may be formed by forming isolation trenches in the substrate 10 by selectively etching the substrate 10 and then burying the isolation trenches with an insulating material.

Next, word lines 12 are formed in the substrate 10 in which the isolation layers 11 are formed. The word line 12 may have a line shape which extends in a second direction (see the C-C') intersecting the isolation layer 11. The word line 12 may be formed by forming trenches by selectively etching the substrate over the isolation layers 11 and then burying some of the trenches with a conductive material. A depth of the trench for the word line 12 may be smaller than that of the trench for the isolation layer 11. After the conductive material is buried, capping layers 13 protecting the word lines 12 may be formed by burying the remaining space of the trench with the insulating material. Further, although not illustrated, a gate insulating layer may be interposed between the word line 12 and the substrate 10. In one implementation, the word lines 12 are buried in the substrate 10. In other implementations, the word lines may be formed over the substrate 10 while having a line shape which extends in the second direction.

In this implementation, the isolation layers 11 and the word lines intersect each other and the isolation layers 11 and the word lines 12 may overlap each other at a portion where they intersect each other (see a cross-sectional view of the line A-A'). Active regions 10A are arranged in a grid shape in this implementation and are defined in the substrate 10 by the isolation layers 11 and the word lines 12.

Figure 2A:
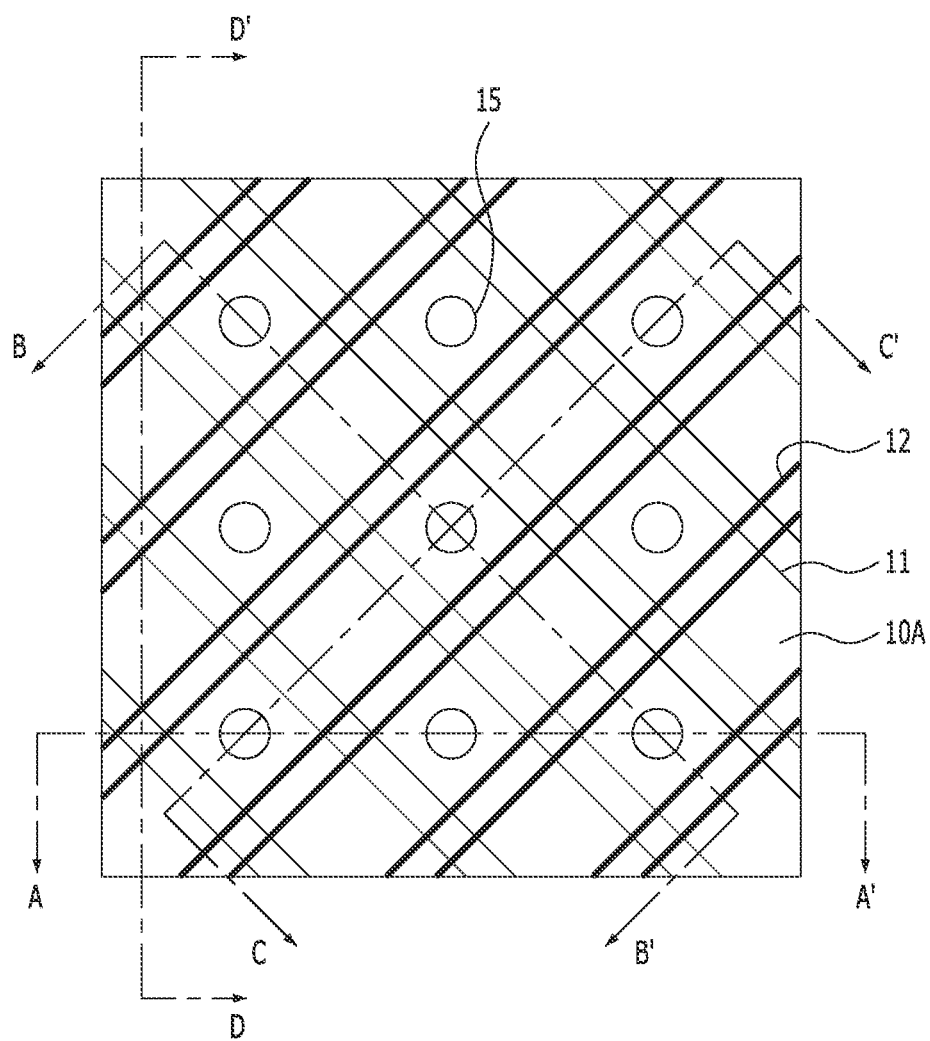
Figure 2B:
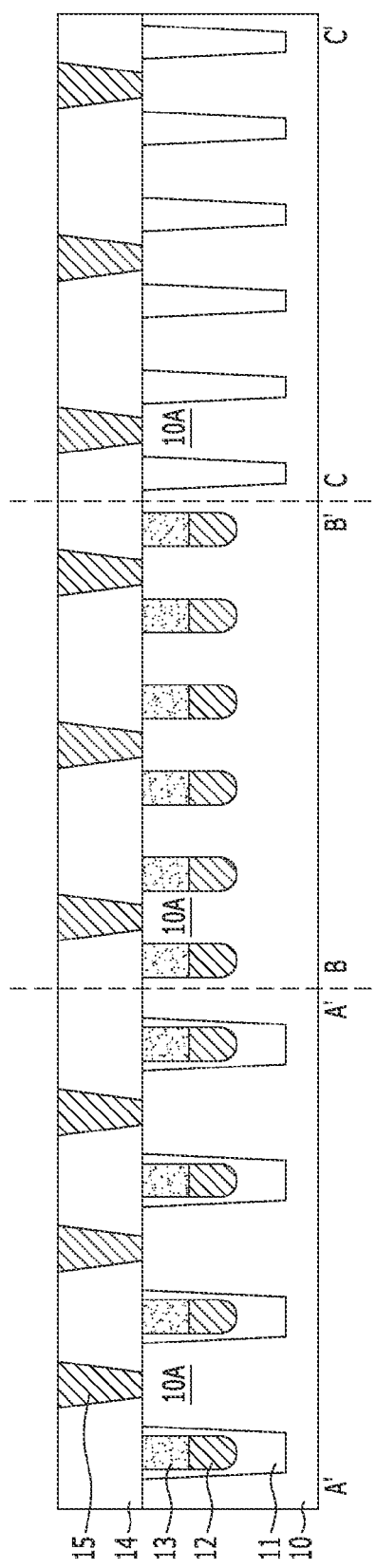

Referring to FIGS. 2A and 2B, first interlayer dielectrics 14 and first contacts 15 are formed on the resultant structure of FIGS. 1A and 1B. The first contacts 15 are coupled to some of the active regions 10A by penetrating through the first interlayer dielectrics 14.

In this implementation, the first contacts 15 are disposed over the active regions 10A to be alternately arranged in the first direction and the second direction. In this configuration, the first contacts 15 are disposed in every other action regions along the first or second direction. For example, the first contacts 15 may be disposed over only even-numbered active regions 10A or only odd-numbered active regions 10A. In a different implementation, the first contacts 15 may be disposed over each active region 10A in a third direction (see the line A-A') and a fourth direction (see the line D-D') which intersect the first and second directions. As described in one example below, the third direction may be parallel with an extending direction of a source line and the fourth direction may be parallel with an extending direction of a bit line.

The first interlayer dielectrics 14 may be formed by depositing the insulating material, such as oxide, on the resultant structure of FIGS. 1A and 1B. Further, the first contacts 15 may be formed by forming contact holes exposing portions of the active regions 10A by selectively etching the first interlayer dielectrics 14 and then burying the contact holes with the conductive material.

Figure 3A:
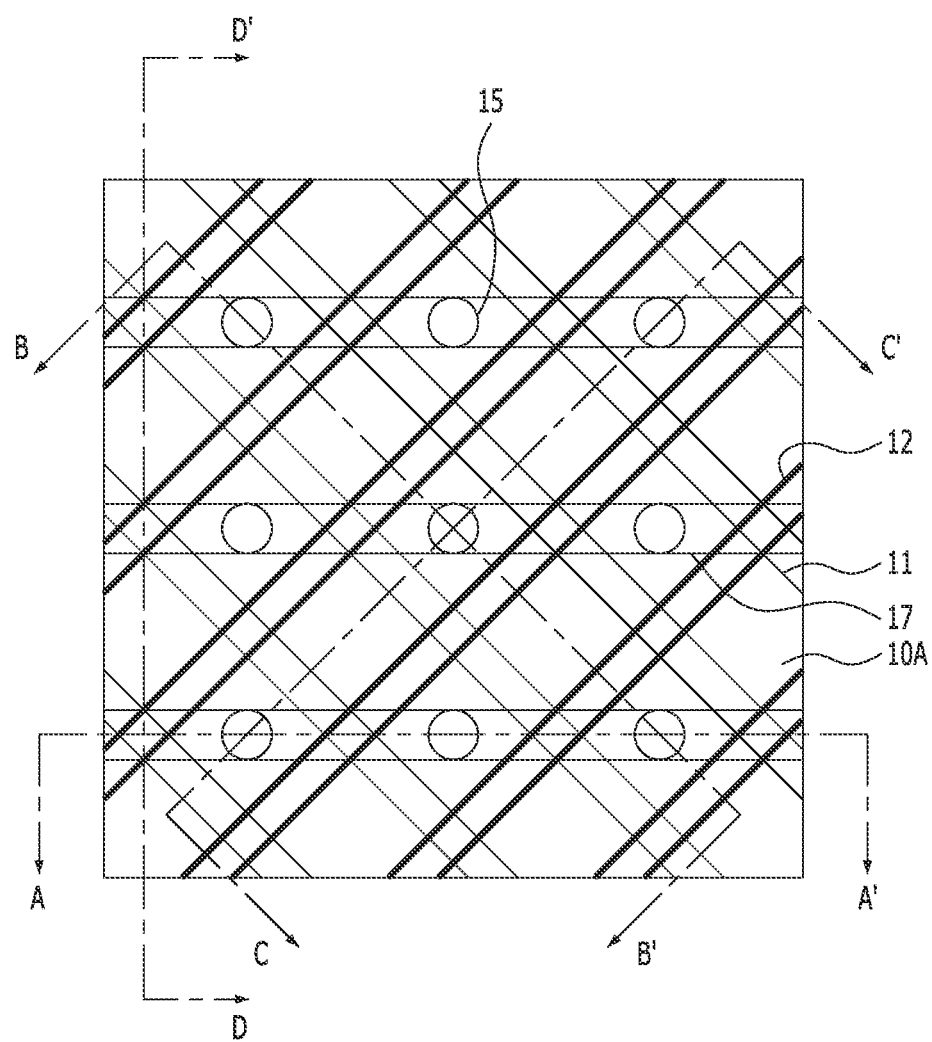
Figure 3B:
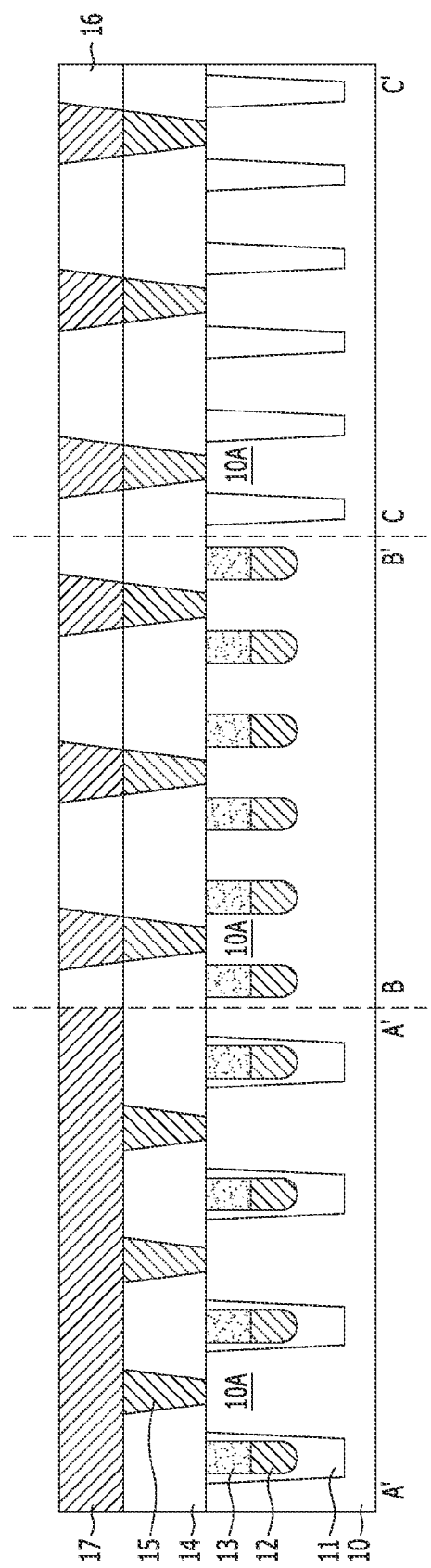

Referring to FIGS. 3A and 3B, the source lines 17 are formed on the resultant structure of FIGS. 2A and 2B and are structured to extend in the third direction. The source lines 17 contact columns of the first contacts 15 arranged in the third direction. A space between the source lines 17 may be buried with second interlayer dielectrics 16. In this case, the first contact 15 may serve as a source line contact which couples the active region 10A to the source line 17.

In one example, the second interlayer dielectrics 16 and the source lines 17 may be formed by the following processes. For example, the insulating material for forming the second interlayer dielectric 16 is deposited on the resultant structure of FIGS. 2A and 2B, the insulating material is selectively etched to form a space for forming the source lines 17, and then the space may be buried with conductive material for forming the source line 17. The conductive material may include, for example, a metal such as Cu, W, and Ta, or a metal nitride such as TiN. Other implementations are also possible for forming the source lines 17. The source line 17 may be formed by depositing the conductive material and then directly etching it. In some implementations, the source lines 17 are formed along with gate electrodes in a peripheral circuit region (not illustrated) and thus include the same structure as the gate electrode in the peripheral circuit region, for example, a stack layer of a polysilicon layer and a metal or metal silicide layer.

Referring to FIGS. 4A and 4B, third interlayer dielectrics 18 and second contacts 19 are formed on the resultant structure of FIGS. 3A and 3B. The second contacts 19 are coupled to some of the active regions 10A by penetrating through the third interlayer dielectrics 18, the second interlayer dielectrics 16, and the first interlayer dielectrics 14.

The plurality of active regions 10A arranged in the first direction form columns of first active regions and the plurality of active regions 10A arranged in the second direction form columns of second active regions. In this case, the second contacts 19 are disposed over the active regions 10A where first contacts 15 are not disposed. Further, the second contacts 19 are alternately disposed over the columns of the first active regions and the columns of the second active regions. With respect to columns of first active regions, the second contacts 19 are disposed over columns of even-numbered first active regions or columns of odd-numbered first active regions. With respect to columns of second active regions, the second contacts 19 are disposed over columns of even-numbered second active regions or columns of odd-numbered second active regions. The second contacts 19 are alternately disposed over the active regions 10A which are arranged in the third and fourth directions.

The third interlayer dielectrics 18 may be formed by depositing the insulating material, such as oxide, on the resultant structure of FIGS. 1A and 1B. In one example, the second contacts 19 may be formed by following processes: selectively etching the third interlayer dielectrics 18, the second interlayer dielectrics 16, and the first interlayer dielectrics 14 to form the contact holes exposing portions of the active regions 10A and then burying the contact holes with the conductive material.

Next, first variable resistance elements 20 are formed over the third interlayer dielectrics 18. The first variable resistance elements 20 and the second contacts 19 are coupled by overlapping the first variable resistance elements 20 and the second contacts 19. The first variable resistance element 20 may be formed by forming a material layer over the third interlayer dielectric 18 and then selectively etching the material layer.

The first variable resistance element 20 is an element having a characteristic switched between different resistant states according to a voltage or a current applied to both terminals thereof and may store data using the characteristic. For example, when the first variable resistance element 20 is in a low resistant state, the first variable resistance element may store data '0', while when the first variable resistance element 20 is in a high resistant state, the first variable resistance element 20 may store data '1'. The first variable resistance element 20 may be configured of a single layer or a multilayer which includes materials used for ReRAM, PCRAM, MRAM, FRAM, etc., for example, oxide, metal oxides such as perovskite-based material, a phase change material such as a chalcogenide-based material, a ferroelectric material, a ferromagnetic material, etc. However, other various configurations can be provided for material or structure of the variable resistance element if satisfying the characteristic switched between different resistant states.

In particular, when the semiconductor device in accordance with the implementation is the MRAM, the first variable resistance element 20 may be a magneto resistive element including a stack structure including a lower magnetic layer, a tunnel barrier layer, and an upper magnetic layer are stacked. In this case, since a resistance value of the first variable resistance element 20 varies depending on magnetization directions of the lower magnetic layer and the upper magnetic layer, the semiconductor device may store data. For example, when the magnetization directions of the lower magnetic layer and the upper magnetic layer are parallel with each other, the resistance value of the first variable resistance element 20 may be relatively smaller and when the magnetization directions thereof are anti-parallel with each other, the resistance value of the first variable resistance element 20 may be relatively larger.

Referring to FIGS. 5A and 5B, fourth interlayer dielectrics 21 and third contacts 22 are formed on the resultant structure of FIGS. 4A and 4B. The third contacts 22 are coupled to portions of the active regions 10A by penetrating through the fourth interlayer dielectrics 21, the third interlayer dielectrics 18, the second interlayer dielectrics 16, and the first interlayer dielectrics 15. The third contacts 22 are formed over the active regions 10A where the first contacts 15 and the second contacts 19 are not disposed.

The fourth interlayer dielectrics 21 may be formed by depositing the insulating material, such as oxide, on the resultant structure of FIGS. 4A and 4B. Further, the third contacts 22 may be formed by the following examples of processes: forming the contact holes exposing portions of the active regions 10A by selectively etching the fourth interlayer dielectrics 21, the third interlayer dielectrics 18, the second interlayer dielectrics 16, and the first interlayer dielectrics 14 and then burying the contact holes with the conductive material.

Next, second variable resistance elements 23 are formed over the fourth interlayer dielectrics 21. The second variable resistance elements 23 and the third contacts 22 are coupled by spatially overlapping the second variable resistance elements 23 and the third contacts 22. Each second variable resistance element 23 is substantially the same as the first variable resistance elements 20 and may be formed by the same method for forming the first variable resistance elements 20.

The coupling of the second contacts 19 and the first variable resistance elements 20 and the coupling of the third contacts 22 and the second variable resistance elements 23 are alternately disposed over the active regions 10A in the third and fourth directions.

Referring to FIGS. 6A and 6B, fifth interlayer dielectrics 24, fourth contacts 25 and fifth contacts 26 are formed on the resultant structure of FIGS. 5A and 5B. The fourth contacts 25 are coupled to the first variable resistance elements 20 by penetrating through the fourth and fifth interlayer dielectrics 21 and 24. The fifth contacts 26 are coupled to the second variable resistance elements 23 by penetrating through the fifth interlayer dielectrics 24. The fourth contacts 25 overlap the first variable resistance elements 20 and the fifth contacts 26 overlap the second variable resistance elements 23. Although the bottoms of the fourth and fifth contacts 25 and 26 may be positioned at different heights from each other, but the tops thereof may be positioned at the same heights.

In one example, the fourth and fifth contacts 25 and 26 may be formed by forming the contact holes by selectively etching the fourth interlayer dielectrics 21 and/or the fifth interlayer dielectrics 24 until the upper surfaces of the first variable resistance element 20 and the second variable resistance element 23 are exposed and then burying the contact holes with the conductive material.

Next, bit lines 27 are formed to extend in the fourth direction while contacting the fourth contacts 25 and the fifth contacts 26 which are alternately arranged over the fifth interlayer dielectrics 24 in the fourth direction. A space between the bit lines 27 may be buried with interlayer dielectrics (not illustrated). In this case, the fourth and fifth contacts 25 and 26 may serve as bit line contacts to couple the first and second variable resistance elements 20 and 23 to the bit lines 27.

The bit lines 27 may be performed by the following processes. For example, the insulating material is deposited over the fifth interlayer dielectrics 24 and is selectively etched to provide a space for the bit lines 27, where the space is buried with the conductive material for forming the bit lines. Other methods for forming the bit lines can also be employed. For example, the bit lines 27 may be formed by directly etching the conductive material.

Upon Completing the Above Process

In FIGS. 6A and 6B, the active regions 10A are arranged in the grid shape and defined over the substrate 10 by the isolation layers 11. The isolations layer 11 have a line shape to extend in the first direction and the word lines 12 extend in the second direction intersecting the first direction.

In the implementation in FIGS. 6A and 6B, two active regions positioned at two sides of a corresponding word line and the word line form a single transistor. The active region 10A at one side of the corresponding word line may be coupled to the source line 17 through the contact and the active region 10A at the other side of the word line may be coupled to the variable resistance elements 20 and 23 and the bit line 27 through the contact. The source line 17 may extend in the third direction which intersects the first direction and the second direction and the bit line 27 may extend in the fourth direction which intersects the first direction, the second direction, and the third direction. In one implementation, the first and second directions may be perpendicular to each other, the third and fourth directions may be perpendicular to each other and an angle formed by one of the first and second directions and one of the third and fourth directions may be approximately 45°. In other implementations, other relationships between the first and second directions and between the third and fourth directions may be used provided that the first and second directions intersect and the third and fourth directions intersect.

The first contacts 15 are disposed over the active regions 10A to couple the source lines 17 to the active regions 10A. Here, the first contacts 15 are alternately disposed over the active regions 10A in the first and second directions and are disposed over each active region 10A in the third and fourth directions. The source lines 17 extending in the third direction contact with the first contacts 15 arranged in the third direction.

The remaining regions other than the active regions 10A (to which the source lines 17 are coupled) are coupled to the bit lines 27. The active regions 10A to which the bit lines 27 are coupled may further be divided into two active regions, that is, an active region coupled to the first variable resistance element 20 and another active region coupled to the second variable resistance element 23. the second contacts 19 are disposed over the active regions to couple the first variable resistance elements 20 to the active regions 10A and. the third contacts 22 are disposed over the active regions to couple the second variable resistance elements 23 to the active regions 10A. The second contacts 19 and the third contacts 22 are alternately disposed over the active regions 10A in the third and fourth directions. Further, the second contact 19 has a height greater than that of the source line 17 and the third contact 22 has a height greater than that of the second contact 19. The first variable resistance elements 20 are disposed over the second contacts 19 and the second variable resistance elements 23 are disposed over the third contacts 22.

The fourth contacts 25 are disposed over the first variable resistance elements 20 to couple the first variable resistance elements 20 to the bit lines 27. The fifth contacts 26 are disposed over the second variable resistance elements 23 to couple the second variable resistance elements 23 to the bit lines 27. Since the coupling of the second contacts 19 and the first variable resistance elements 20 and the coupling of the third contacts 22 and the second variable resistance elements 23 are alternately arranged in the fourth direction, the fourth contacts 25 and the fifth contacts 26 are alternately arranged in the fourth direction. Further, the bit lines 27 extending in the fourth direction alternately contact the fourth contacts 25 and the fifth contacts 26 in the fourth direction.

The above implementations may be used to achieve one or more following advantages.

Since the isolation layer 11 and the word line 12 form a predetermined angle with respect to the source line 17 and the bit line 27, an inter-pattern distance may increase without increasing a plane area. For example, since the first contacts 15 are alternately formed over each active region 10A in the first and second directions, a distance between the first contacts 15 may increase. In addition, since the first contacts 15 are formed over the active region 10A in a diagonal direction along the third and fourth directions, a distance between the adjacent first contacts 15 may increase. Similarly, a distance between the second contacts 19, a distance between the third contacts 22, a distance between the fourth contacts 25, a distance between the fifth contacts 26, a distance between the source lines 17, a distance between the bit lines 27, etc., may increase as well. The increase of the inter-pattern distance results in the increase of the pattern size, which enables an easier patterning process. Further, the increasing of the inter-pattern distance results in the increase of an overlay margin, which allows to reduce unexpected short-circuits between patterns.

Further, since the elements of the semiconductor device such as the word lines 12, the source lines 17, the first variable resistance elements 20, the second variable resistance elements 23, and the bit lines 27 are formed over different layers that are positioned at different heights, the possibility of the short-circuit therebetween may decrease. Further, fabricated elements of the semiconductor device are formed over different layers such that the size of each element may be increased to allow the patterning process to be more easily performed. In particular, if the first and second variable resistance elements 20 and 23 are magneto resistive elements used for the MRAM, the present implementations can acquire additional advantages. The magneto resistive element has a multilayer structure including the stack structure of the lower magnetic layer, the tunnel barrier layer, and the upper magnetic layer, and at least one additional layer formed over the upper or lower portion of the stack structure. With the multilayer structure of the magneto resistive element, it is very difficult to perform the etching. If an interval between the magneto resistive elements decreases, the desired patterning thereon may not be performed. Under the aforementioned implementations, since the first and second variable resistance elements 20 and 23 are formed over different layers to be separated from each other, an interval between the adjacent variable resistance elements may be increased, e.g., two times larger than the interval based on other designs, and thus, the patterning may be easily performed.

Accordingly, as the recent trend requires a higher circuit element integration at the same time with a simpler design of the semiconductor device, the process may be easily and effectively performed while securing the reliability of the device.

FIGS. 7A to 12B are diagrams for explaining an example of a method for fabricating the semiconductor device and the semiconductor device fabricated. In numbering drawings, the suffix "A" illustrates plan views, suffix "B" illustrates cross-sectional views taken along predetermined lines of the corresponding plan views.

Figure 7A:
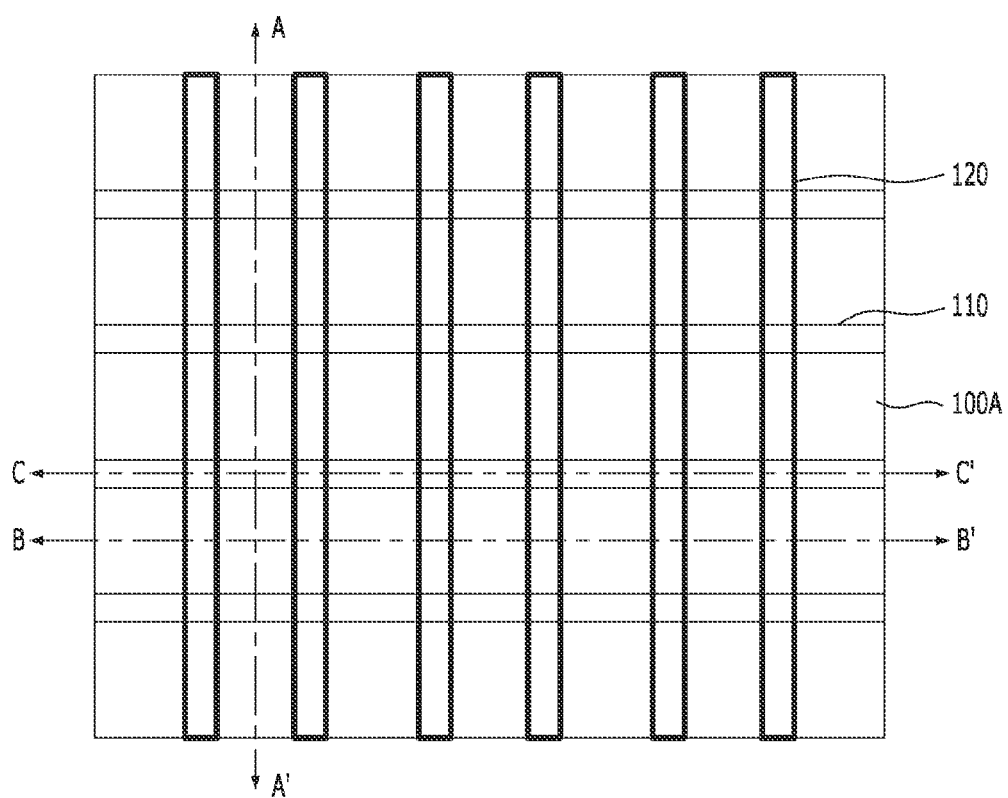
FIGS. 7A to 12B are diagrams for explaining an example of a method for fabricating a semiconductor device
Figure 7B:
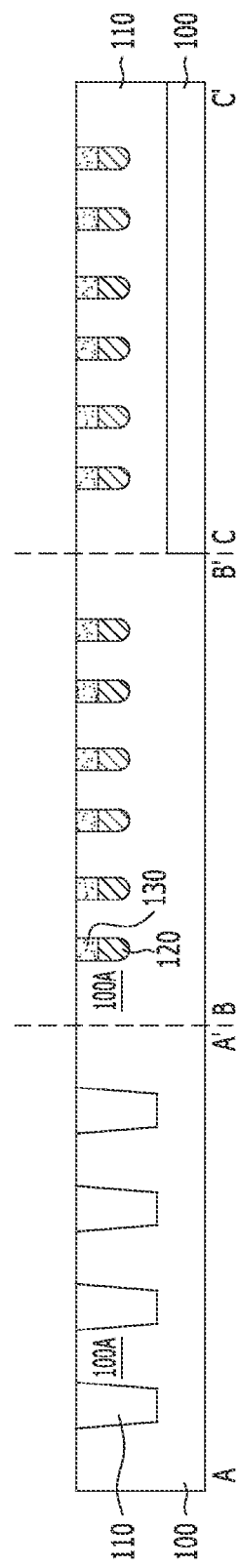

Referring to FIGS. 7A to 7B, the isolation layers 110 are formed in the substrate 100. The isolation layer 110 may have a line shape which extends in a first direction (see the line B-B' or the line C-C').

Next, the word lines 120 are formed in the substrate 100 over which the isolation layers 110 are formed. The word line 120 may have a line shape which extends in a second direction (see the A-A') intersecting the isolation layer 110. An upper surface of the word line 120 may be covered with the capping layer 130.

Active regions 100A which are arranged in a grid shape are defined in the substrate 100 by the isolation layers 110 and the word lines 120.

Figure 8A:
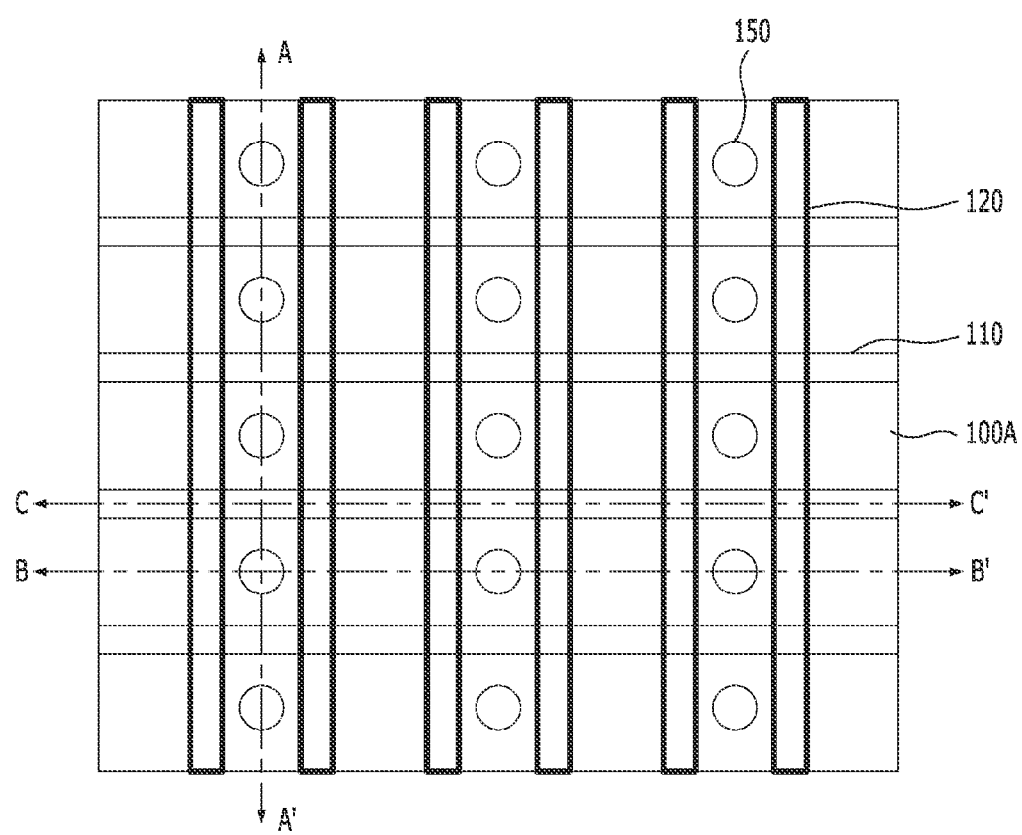

Referring to FIGS. 8A and 8B, first interlayer dielectrics 140 and first contacts 150 are formed on the resultant structure of FIGS. 7A and 7B. The first contacts 150 are coupled to portions of the active regions 100A by penetrating through the first interlayer dielectrics 140.

The first contacts 150 are alternately disposed over the active regions 100A in the first direction. In other words, the first contacts 150 may be disposed over only even-numbered active regions 100A or only odd-numbered active regions 100A among the active regions 100A arranged in the first direction. On the other hand, the first contacts 150 may be disposed over each active region 100A in the second direction.

Figure 9A:
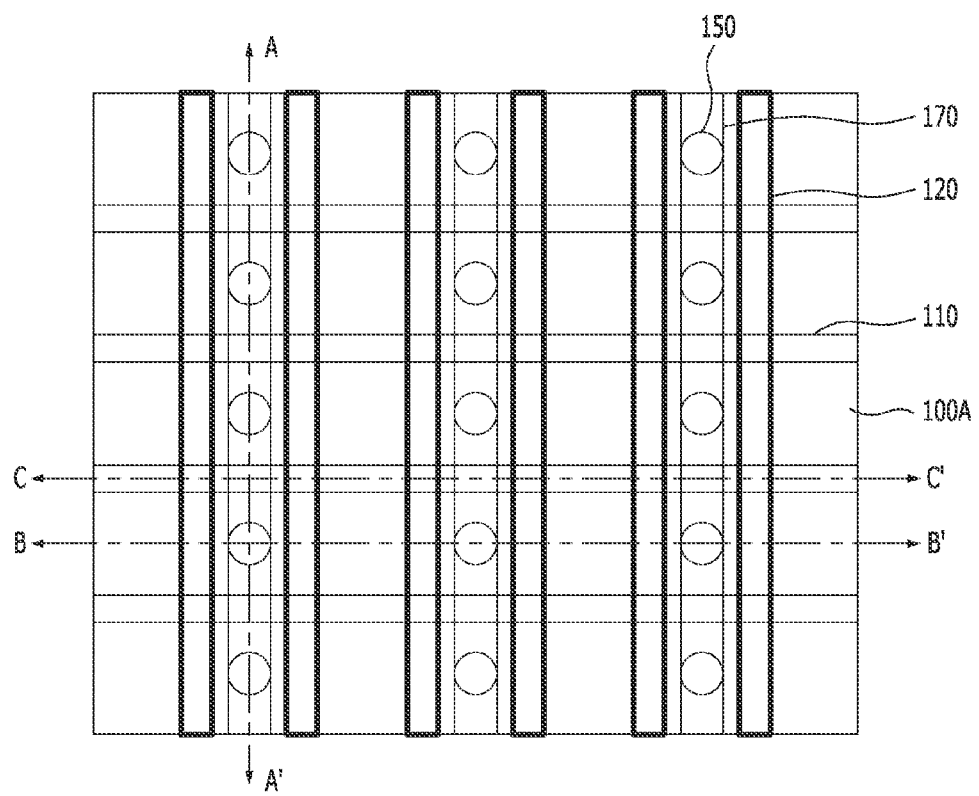
Figure 9B:
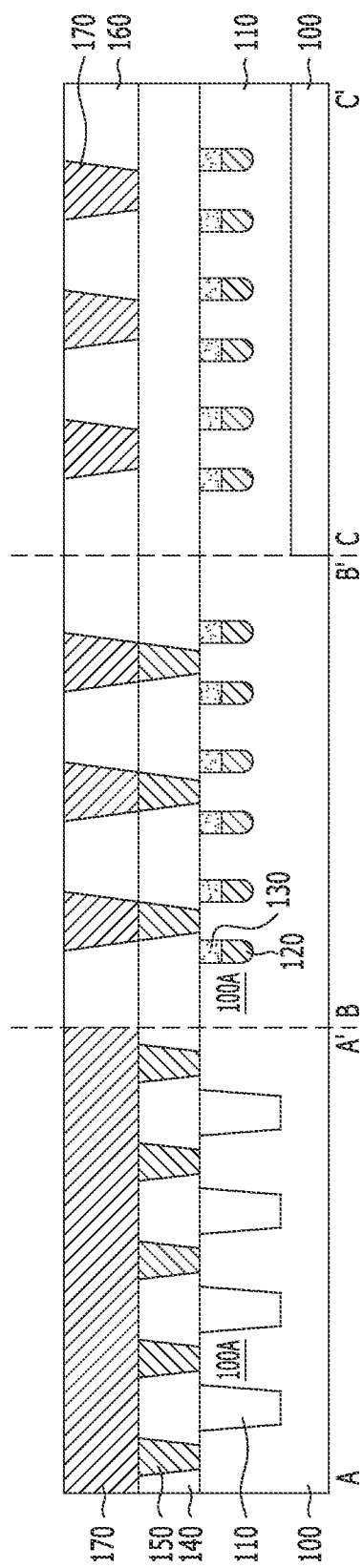

Referring to FIGS. 9A and 9B, source lines 170 extending in the second direction are formed on the resultant structure of FIGS. 8A and 8B. The first contacts 150 arranged in the second direction form columns of the first contacts 150 and the source lines contact with the columns of the first contacts 150. A space between the source lines 170 may be buried with second interlayer dielectrics 160.

Figure 10A:
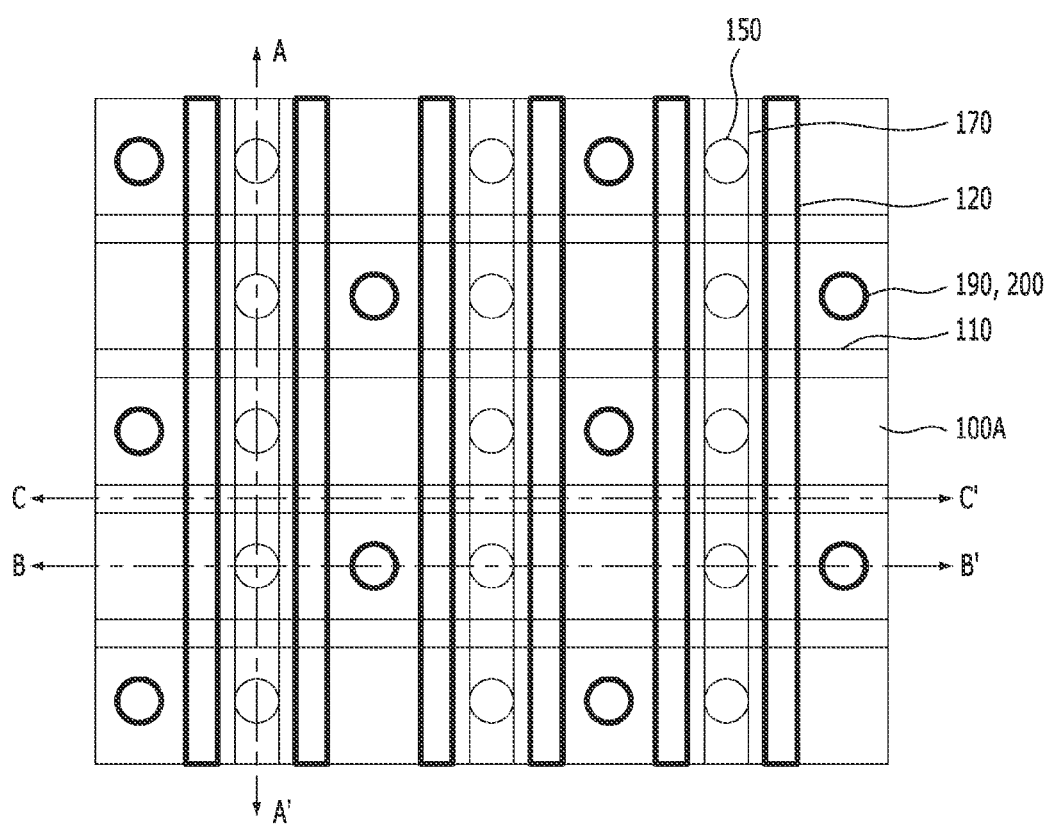
Figure 10B:
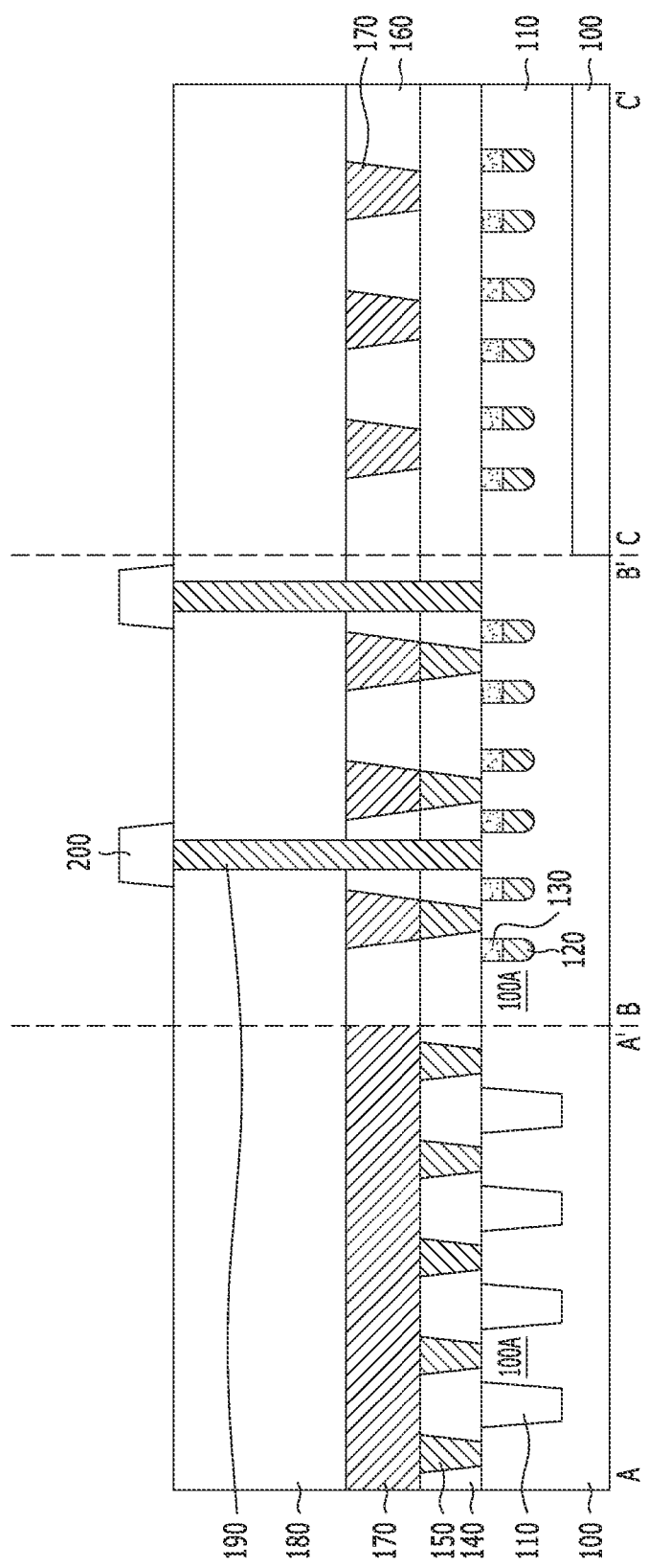

Referring to FIGS. 10A and 10B, third interlayer dielectrics 180 are formed on the resultant structure of FIGS. 9A and 9B. After the third interlayer dielectrics 180 are formed, second contacts 190 are formed by penetrating through the third interlayer dielectrics 180, the second interlayer dielectrics 160, and the first interlayer dielectrics 15 and coupled to portions of the active regions 100A.

The plurality of active regions 100A arranged in the first direction form columns of first active regions and the plurality of active regions 100A arranged in the second direction form columns of second active regions. The second contacts 190 are disposed over the active regions 100A where the first contacts 150 are not disposed. Further the second contacts 19 are alternately disposed over the active regions 100A of the columns of the first active regions and the active region 100A of the columns of the second active regions. In other words, the second contacts 190 are disposed in a zigzag form over the active regions 100A where the first contacts 150 are not disposed.

Next, first variable resistance elements 200 are formed over the third interlayer dielectrics 180. The first variable resistance elements 200 and the second contacts 190 are coupled by overlapping the first variable resistance elements 200 and the second contacts 190.

Figure 11A:
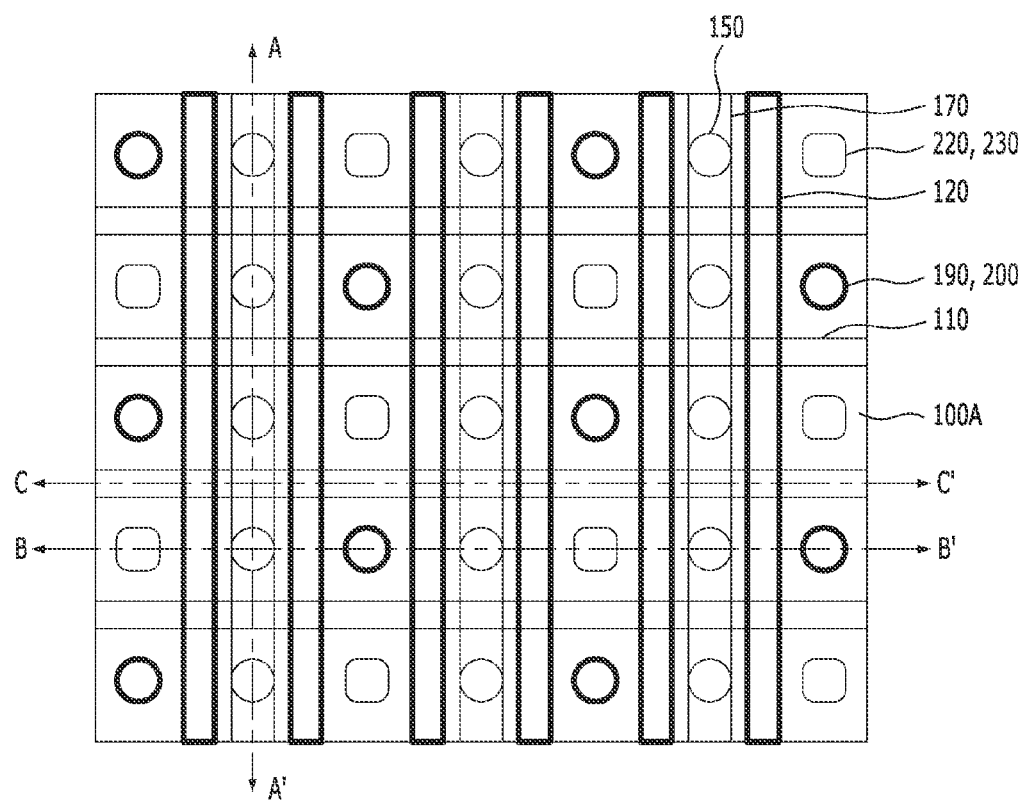
Figure 11B:
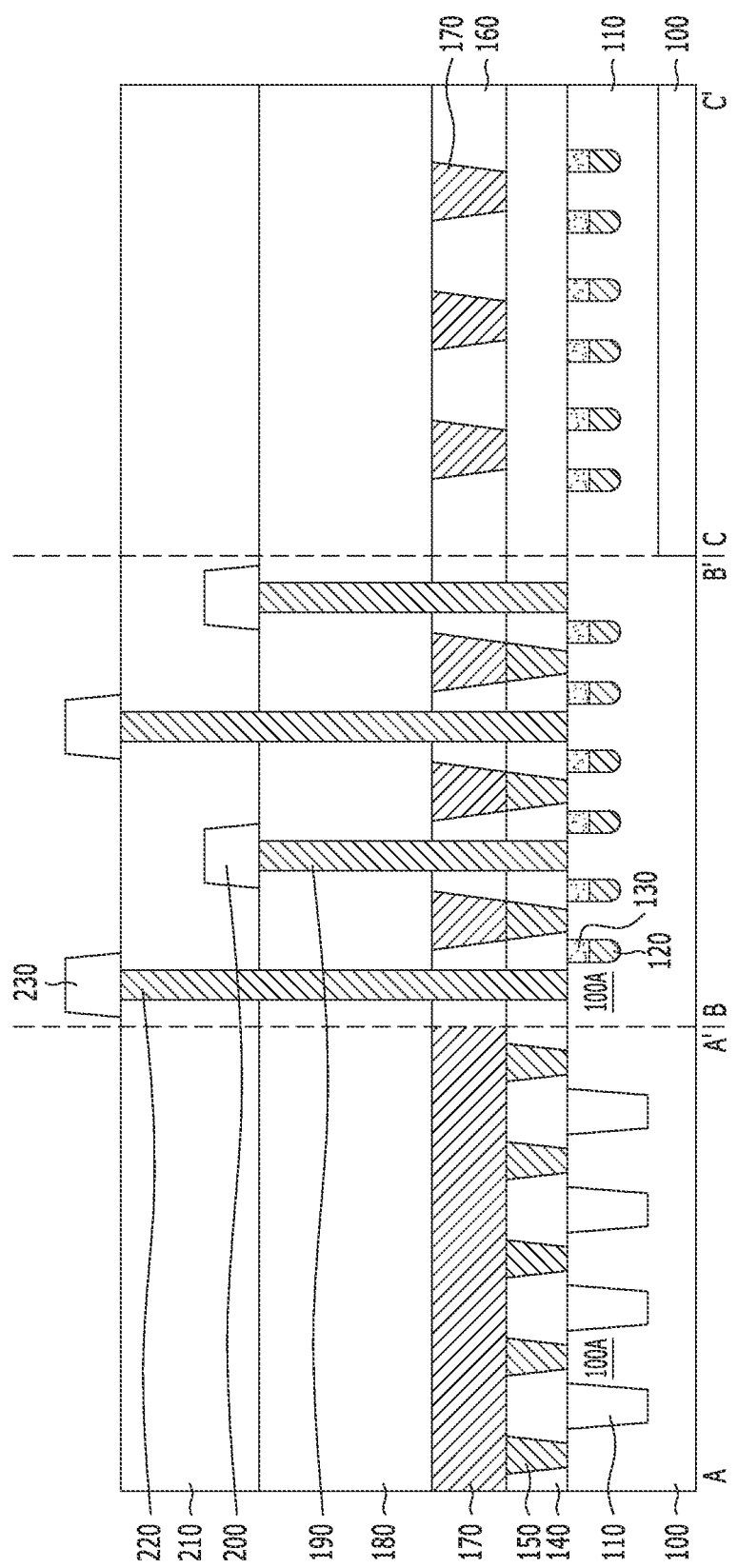

Referring to FIGS. 11A and 11B, fourth interlayer dielectrics 210 and third contacts are formed on the resultant structure of FIGS. 10A and 10B. Third contacts 220 are coupled to portions of the active regions 100A by penetrating through fourth interlayer dielectrics 210, the third interlayer dielectrics 180, the second interlayer dielectrics 160, and the first interlayer dielectrics 140. The third contacts 220 are formed over the active regions 100A where the first contacts 150 and the second contacts 190 are not disposed.

Next, second variable resistance elements 230 are formed over the fourth interlayer dielectrics 210. The second variable resistance elements 230 and the third contacts 220 are coupled by overlapping the second variable resistance elements 230 and the third contacts 220. The coupling of the second contacts 190 and the first variable resistance elements 200 and the coupling of the third contacts 220 and the second variable resistance elements 230 are alternately formed in the second direction over the active regions 100A where the first contacts 140 are not formed.

Figure 12A:
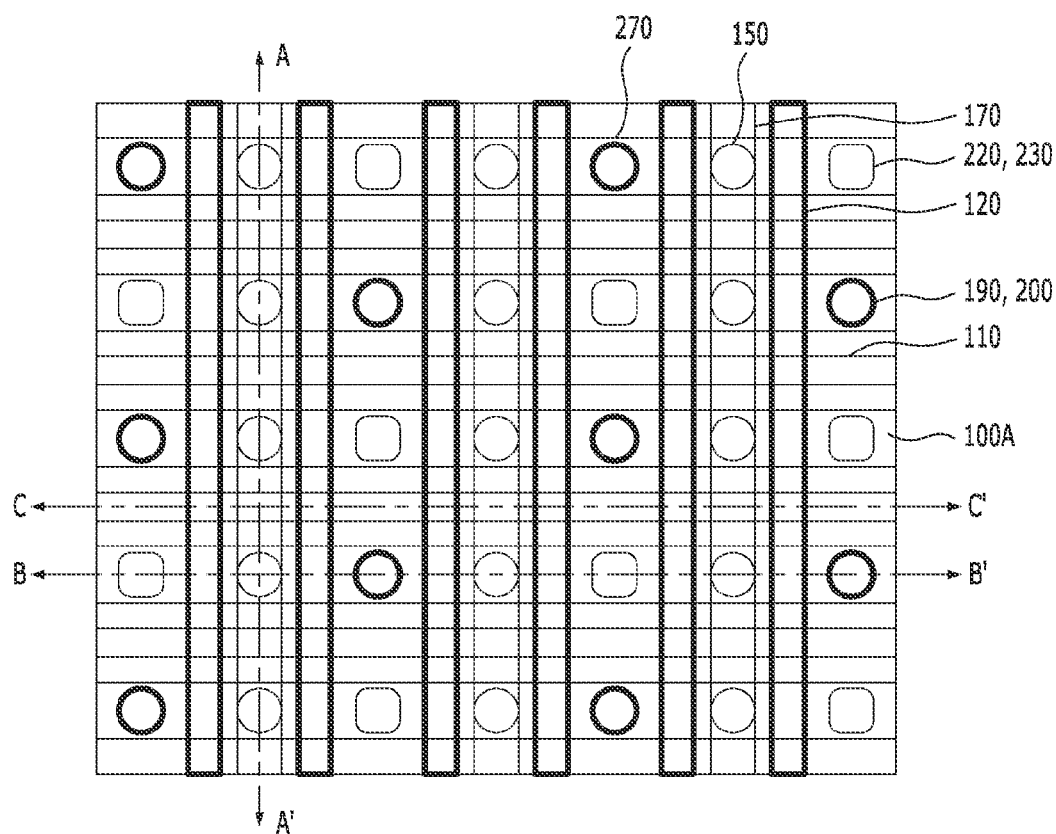
Figure 12B:
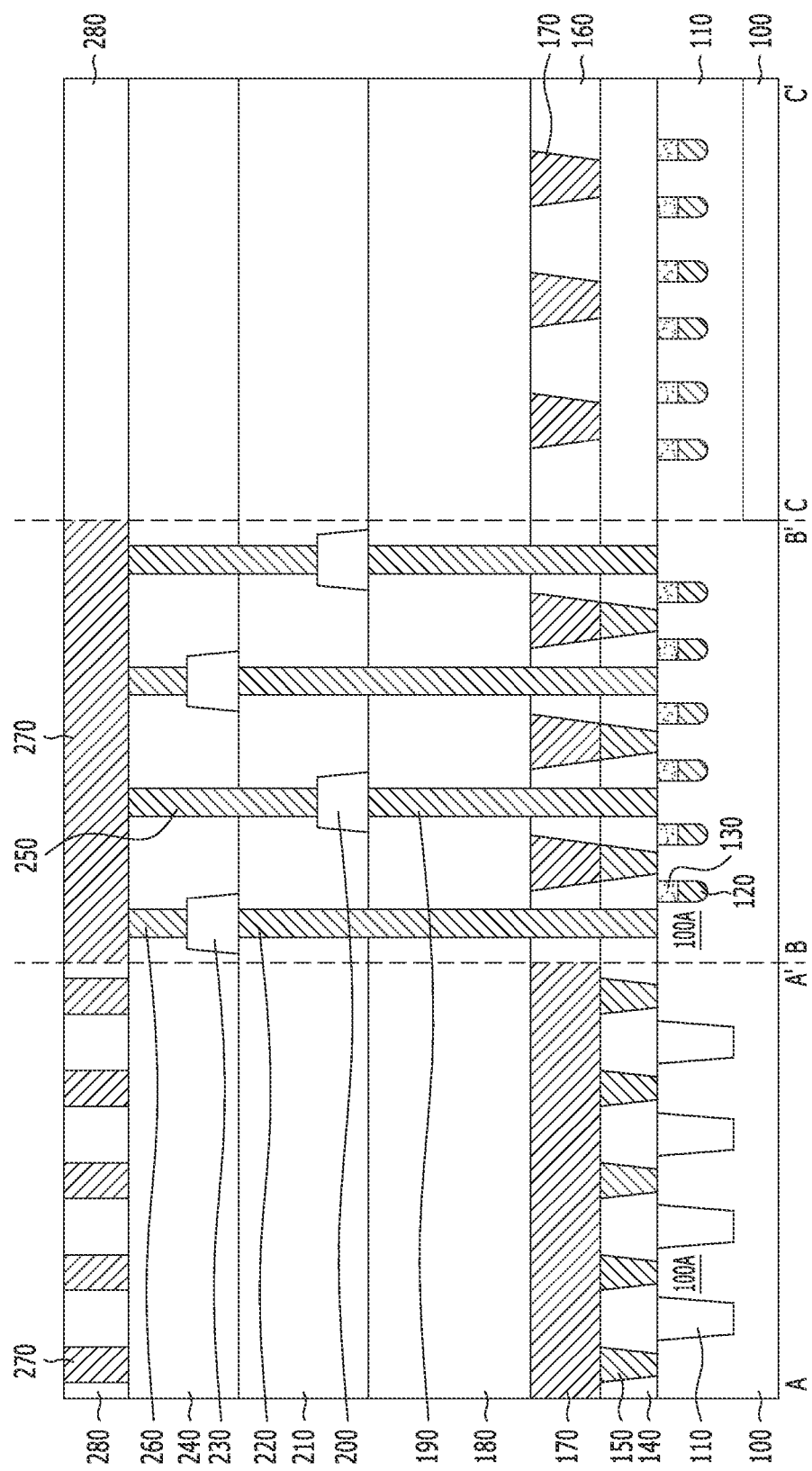

Referring to FIGS. 12A and 12B, fifth interlayer dielectrics 240, fourth contacts 250 and fifth contacts 260 are formed on the resultant structure of FIGS. 11A and 11B. The fourth contacts 250 are coupled to the first variable resistance elements 200 by penetrating through the fourth and fifth interlayer dielectrics 210 and 240. The fifth contacts 260 are coupled to the second variable resistance elements 230 by penetrating through the fifth interlayer dielectrics 240. The fourth contacts 250 overlap the first variable resistance elements 200 and the fifth contacts 260 overlap the second variable resistance elements 230

Next, bit lines 270 are formed over the fifth interlayer dielectrics 240 to extend in the first direction. The bit lines contact with the fourth contacts 250 and the fifth contacts 260 which are alternately arranged over the first active regions where the first contacts 150 are not formed. A space between the bit lines 270 may be buried with sixth interlayer dielectrics 280.

In FIGS. 12A and 12B, the active regions 100A are arranged in the grid shape and defined over the substrate 100 by the isolation layers 110 and the word lines. The isolation layers 110 have a line shape which extend in the first direction and the word lines 120 extend in the second direction intersecting the first direction.

The active regions positioned at two sides of a corresponding word line form a single transistor. The active region 100A at one side of a corresponding word line 120 may be coupled to the source line 170 through the contact and the active region 100A formed at the other side of the other side may be coupled to the variable resistance elements 200 and 230 and the bit line 270 through the contact. The source lines 170 may extend in the second direction and the bit lines 270 may extend in the first direction.

The first contacts 150 are disposed over the active regions 100A to which the source lines 170 are coupled. Here, the first contacts 150 are alternately disposed over the active regions 100A in the first direction and are disposed over each active region 100A in the second direction. The source lines 170 are arranged to extend in the second direction while contacting with the first contacts 150. Word lines 120 formed at two sides of a source line 170 are referred to as a pair of word lines 120. The first contacts 150 are disposed over each active region 100A between the pair of word lines 120.

The rest active regions 100A other than the active regions 100A (to which the source lines 170 are coupled) are coupled to the bit lines 270. Such active regions coupled to the bit lines 270 are arranged between two adjacent word lines 120 that do not form the pair of word lines and may be further divided into two active regions: one active region coupled to the first variable resistance element 200 and the other active region coupled to the second variable resistance element 230. The second contacts 190 are disposed over the active regions 100A to which the first variable resistance elements 200 are coupled and the third contacts 220 are disposed over the active regions 100A to which the second variable resistance elements 230 are coupled. Here, the second contacts 190 and the third contacts 220 are alternately disposed over the active regions 100A in the second direction. Further, the second contacts 190 are formed at positions higher than the source line 170 and the third contact 220 are formed at positions higher than the second contact 190. The first variable resistance elements 200 are disposed over the second contacts 190 and the second variable resistance elements 230 are disposed over the third contacts 220.

The fourth contacts 250 are disposed over the first variable resistance elements 200 to couple the first variable resistance elements 200 to the bit lines 270 and the fifth contacts 260 are disposed over the second variable resistance elements 230 to couple the second variable resistance elements 230 to the bit lines 270. The bit lines 270 extend in the first direction while contacting the fourth contacts 250 and the fifth contacts 260 which are alternately arranged in the first direction.

According to the above implementations, the size of the pattern may be increased and this ability of increasing the size can lessen the difficulty in fabrication and improve the patterning process. Further, the possibility of short-circuit between the patterns may decrease, thus improving the reliability of the semiconductor device.

In foregoing implementations, the variable resistance element is disposed as a double layer of the first and second variable resistance elements, various other configurations can be used for variable resistance elements. For example, the variable resistance elements may be disposed over the same layer. In another example, three layers may be used to construct each of the variable resistance elements, which are described with reference to FIGS. 13A and 13B.

Figure 13A:
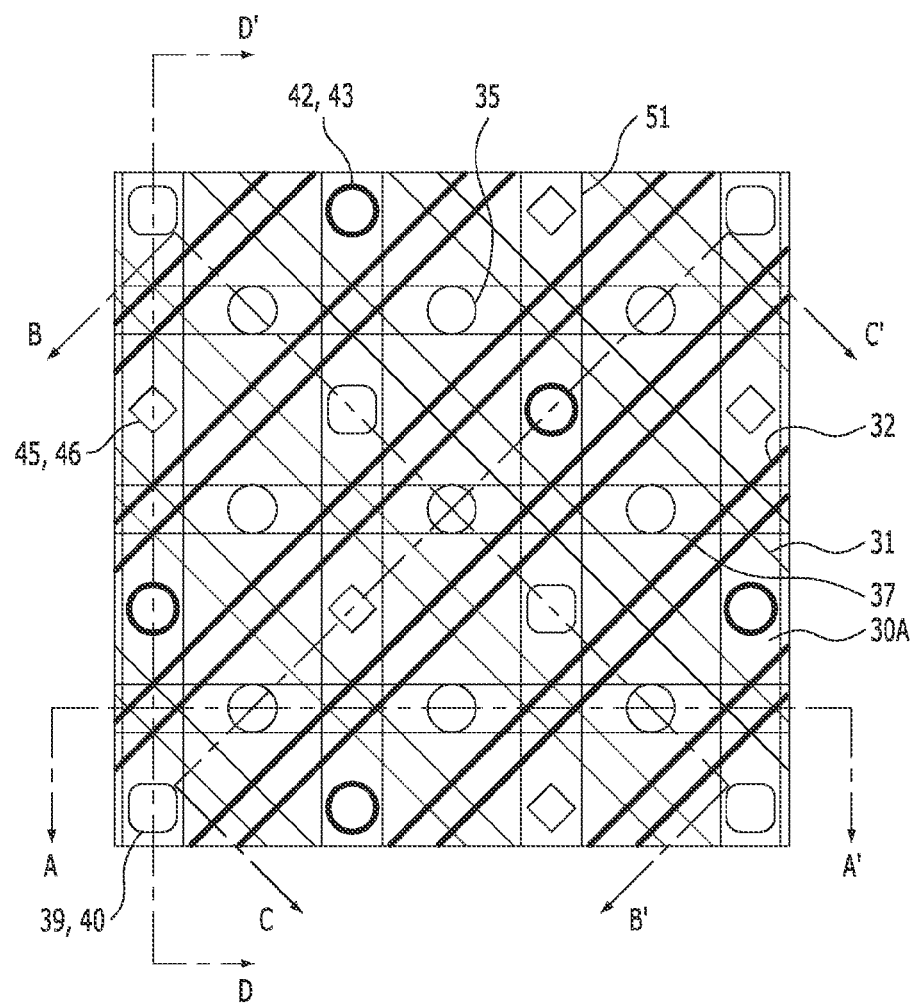
FIGS. 13A and 13B are diagrams illustrating a semiconductor device in accordance with another implementation of the disclosed technology.
Figure 13B:
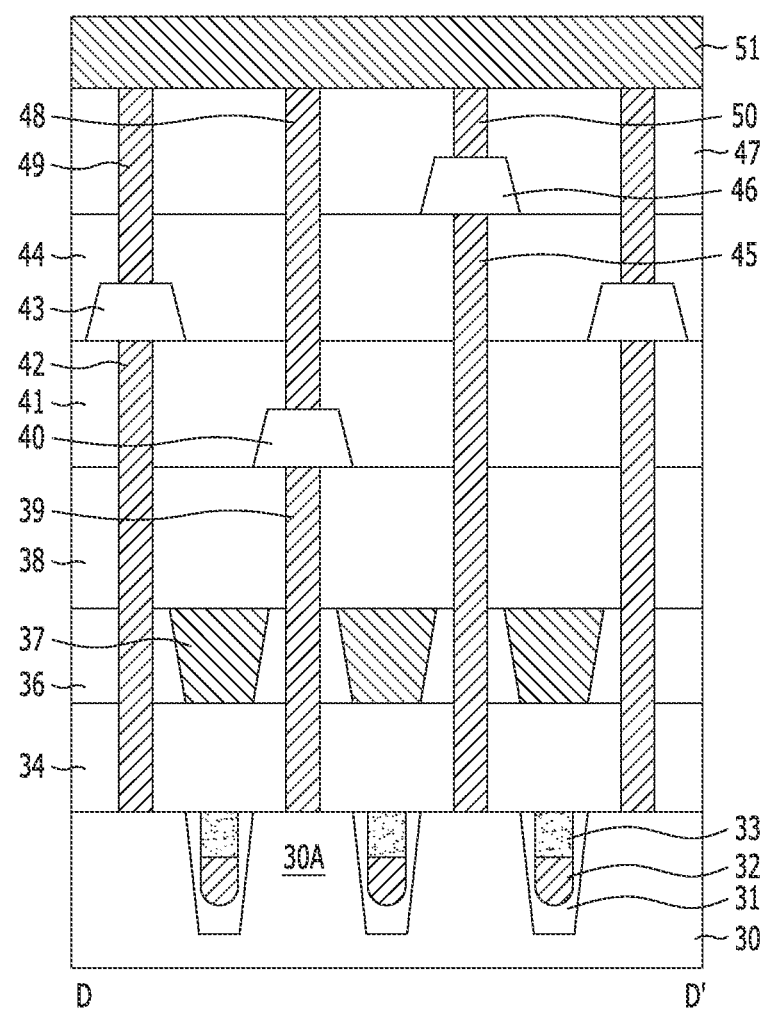

FIGS. 13A and 13B are diagrams illustrating a semiconductor device. The semiconductor device in FIGS. 13A and 13B is the same as the implementation of FIGS. 6A and 6B with the only exception of the disposition of the variable resistance elements Referring to FIGS. 13A and 13B, the rest active regions not contacting with source lines 37 are coupled to bit lines 51. Here, the active regions 30A to which the bit lines 51 are coupled may be divided into three regions including a region coupled to first variable resistance elements 40, a region coupled to second variable resistance elements 46, and a region coupled to third variable resistance elements 43. The first to third contacts 39, 42, and 45 having different heights are formed on three portions of the active regions 30A, respectively. The first to third contacts 39, 42, and 45 may be sequentially and repeatedly disposed in a fourth direction in which bit lines 51 extend. Therefore, the first variable resistance elements 40, the second variable resistance elements 43, and the third variable resistance elements 46 are disposed at different heights.

In accordance with the implementations, an interval between the variable resistance elements may increase, thereby preventing short-circuit between the variable resistance elements. Further, the size of each variable resistance elements may increase, thereby achieving more advantageous patterning processes.

In implementations, the variable resistance elements illustrated in FIGS. 12A and 12B may be disposed over different layers by the same method. Further, four or more layers can be provided for variable resistance elements The above and other memory circuits or semiconductor devices based on the disclosed technology can be used in a range of devices or systems. FIGS. 14-18 provide some examples of devices or systems that can implement the memory circuits disclosed herein.

Figure 14:
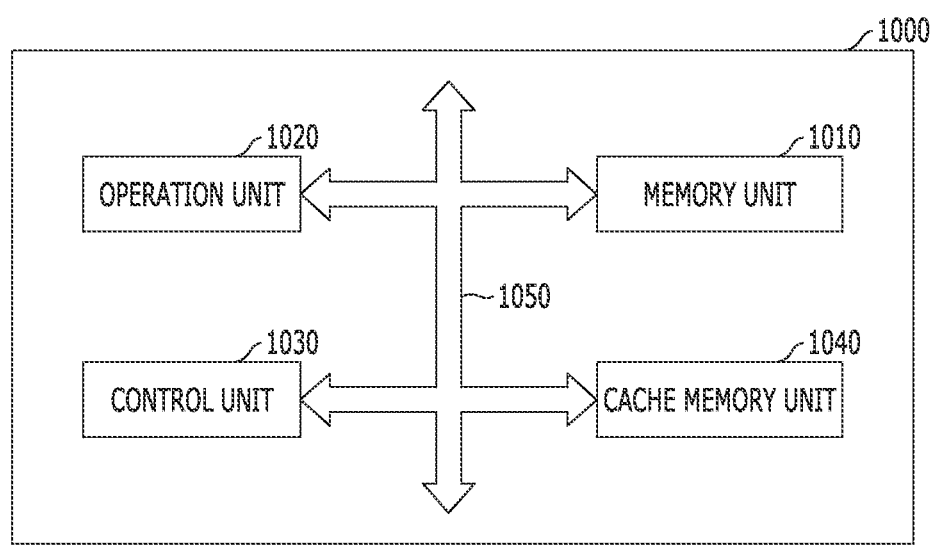
FIG. 14 is an example of configuration diagram of a microprocessor implementing memory circuitry based on the disclosed technology.

FIG. 14 is an example of configuration diagram of a microprocessor implementing memory circuitry based on the disclosed technology.

Referring to FIG. 14, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a substrate configured to include a plurality of active regions which are defined by isolation layers extending in a first direction and word lines extending in a second direction intersecting the first direction; source line contacts configured to be alternately disposed over the active regions arranged in the first and second directions and disposed over each of the active regions arranged in a third direction intersecting the first and second directions; source lines configured to extend in the third direction while being coupled to the source line contacts; contacts configured to be disposed over each of the active regions over which the source line contacts are not disposed; variable resistance elements configured to be disposed over each of the contacts; bit line contacts configured to be disposed over each of the variable resistance elements; and bit lines configured to extend in a fourth direction intersecting the first to third directions while being coupled to the bit line contacts. Through this, the level of integration can increase i and reliability of the memory unit 1010 can be improved. As a consequence, the microprocessor has higher level of integration and improved reliability.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 15:
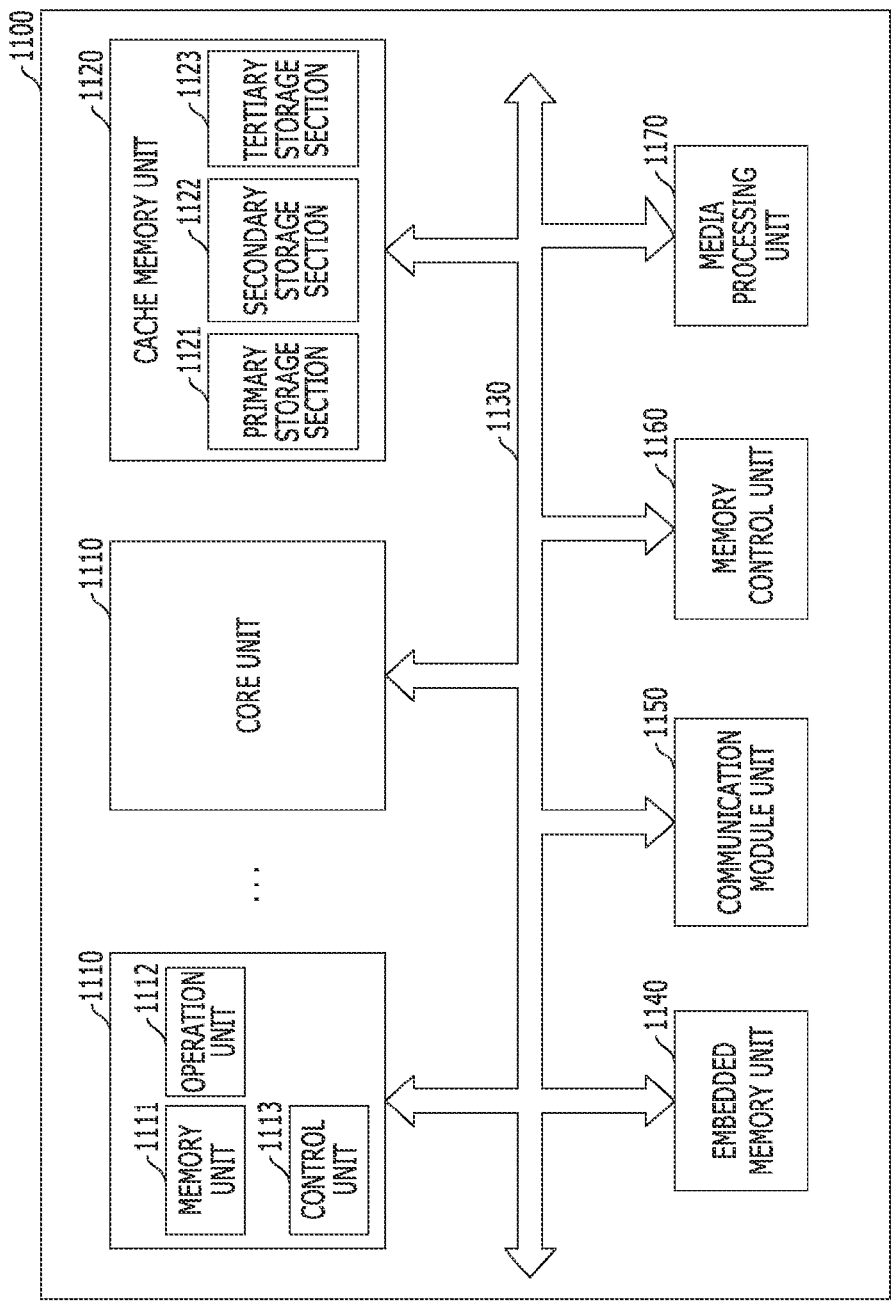
FIG. 15 is an example of configuration diagram of a processor implementing memory circuitry based on the disclosed technology.

FIG. 15 is an example of configuration diagram of a processor implementing memory circuitry based on the disclosed technology.

Referring to FIG. 15, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a substrate configured to include a plurality of active regions which are defined by isolation layers extending in a first direction and word lines extending in a second direction intersecting the first direction; source line contacts configured to be alternately disposed over the active regions arranged in the first and second directions and disposed over each of the active regions arranged in a third direction intersecting the first and second directions; source lines configured to extend in the third direction while being coupled to the source line contacts; contacts configured to be disposed over each of the active regions over which the source line contacts are not disposed; variable resistance elements configured to be disposed over each of the contacts; bit line contacts configured to be disposed over each of the variable resistance elements; and bit lines configured to extend in a fourth direction intersecting the first to third directions while being coupled to the bit line contacts. Through this, the level of integration and reliability of the cache memory unit 1120 can increase. As a consequence, the processor 1100 has higher level of integration and improved reliability.

Although it was shown in FIG. 15 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 16:
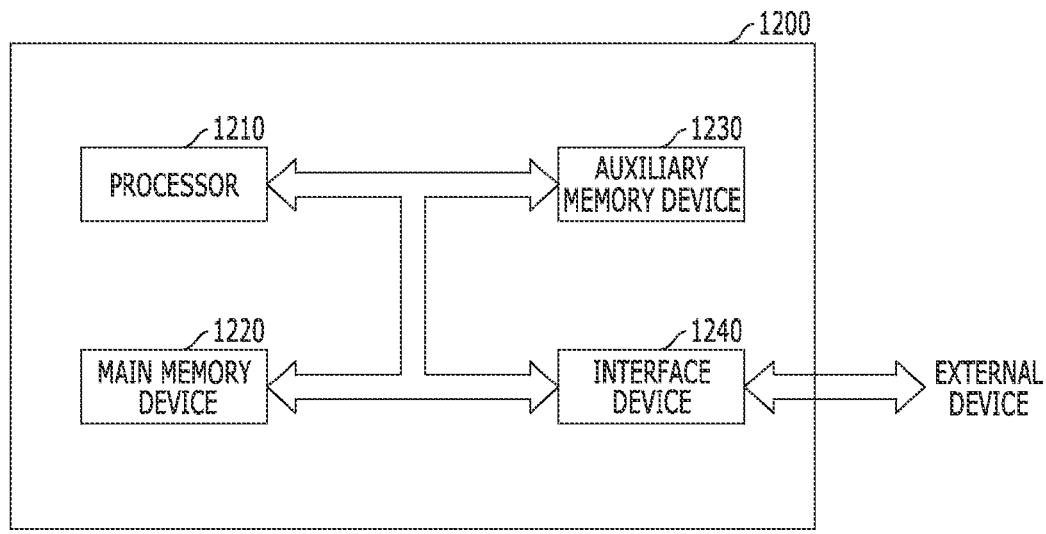
FIG. 16 is an example of configuration diagram of a system implementing memory circuitry based on the disclosed technology.

FIG. 16 is an example of configuration diagram of a system implementing memory circuitry based on the disclosed technology.

Referring to FIG. 16, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a substrate configured to include a plurality of active regions which are defined by isolation layers extending in a first direction and word lines extending in a second direction intersecting the first direction; source line contacts configured to be alternately disposed over the active regions arranged in the first and second directions and disposed over each of the active regions arranged in a third direction intersecting the first and second directions; source lines configured to extend in the third direction while being coupled to the source line contacts; contacts configured to be disposed over each of the active regions over which the source line contacts are not disposed; variable resistance elements configured to be disposed over each of the contacts; bit line contacts configured to be disposed over each of the variable resistance elements; and bit lines configured to extend in a fourth direction intersecting the first to third directions while being coupled to the bit line contacts. Through this, the level of integration and reliability of the main memory device 1220 can increase. As a consequence, the system 1200 has higher level of integration and improved reliability.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a substrate configured to include a plurality of active regions which are defined by isolation layers extending in a first direction and word lines extending in a second direction intersecting the first direction; source line contacts configured to be alternately disposed over the active regions arranged in the first and second directions and disposed over each of the active regions arranged in a third direction intersecting the first and second directions; source lines configured to extend in the third direction while being coupled to the source line contacts; contacts configured to be disposed over each of the active regions over which the source line contacts are not disposed; variable resistance elements configured to be disposed over each of the contacts; bit line contacts configured to be disposed over each of the variable resistance elements; and bit lines configured to extend in a fourth direction intersecting the first to third directions while being coupled to the bit line contacts. Through this, the level of integration and reliability of the auxiliary memory device 1230 can increase. As a consequence, the system 1200 has higher level of integration and improved reliability.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 17:
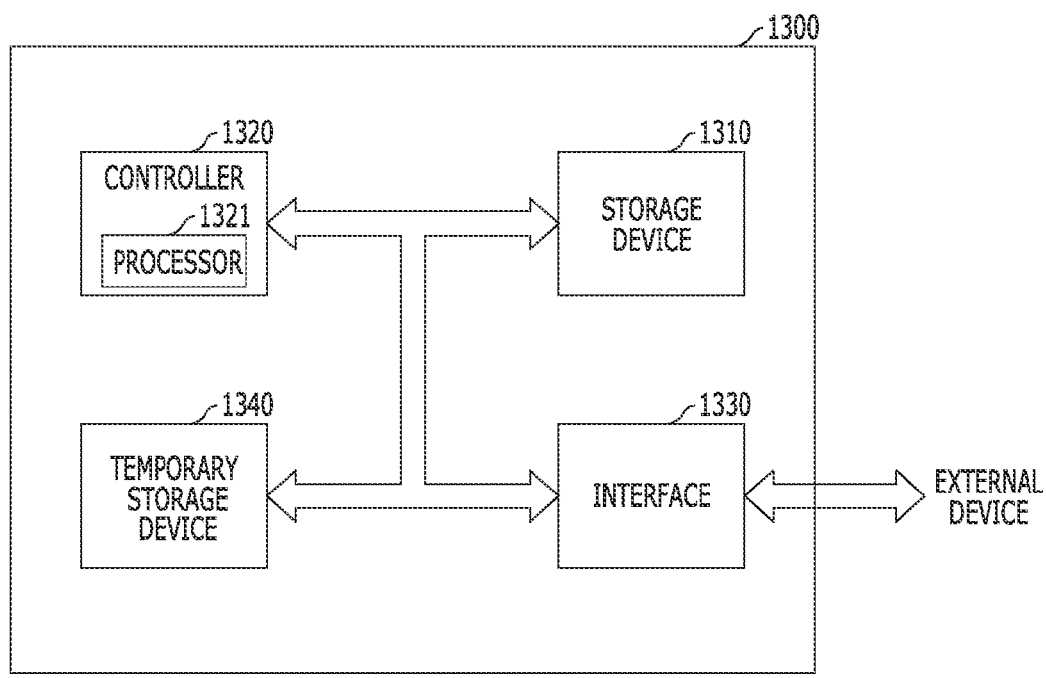
FIG. 17 is an example of configuration diagram of a data storage system implementing memory circuitry based on the disclosed technology.

FIG. 17 is an example of configuration diagram of a data storage system implementing memory circuitry based on the disclosed technology.

Referring to FIG. 17, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a substrate configured to include a plurality of active regions which are defined by isolation layers extending in a first direction and word lines extending in a second direction intersecting the first direction; source line contacts configured to be alternately disposed over the active regions arranged in the first and second directions and disposed over each of the active regions arranged in a third direction intersecting the first and second directions; source lines configured to extend in the third direction while being coupled to the source line contacts; contacts configured to be disposed over each of the active regions over which the source line contacts are not disposed; variable resistance elements configured to be disposed over each of the contacts; bit line contacts configured to be disposed over each of the variable resistance elements; and bit lines configured to extend in a fourth direction intersecting the first to third directions while being coupled to the bit line contacts. Through this, the level of integration and reliability of the storage device 1310 or the temporary storage device 1340 can increase. As a consequence, the data storage system 1300 has higher integration and improved reliability.

Figure 18:
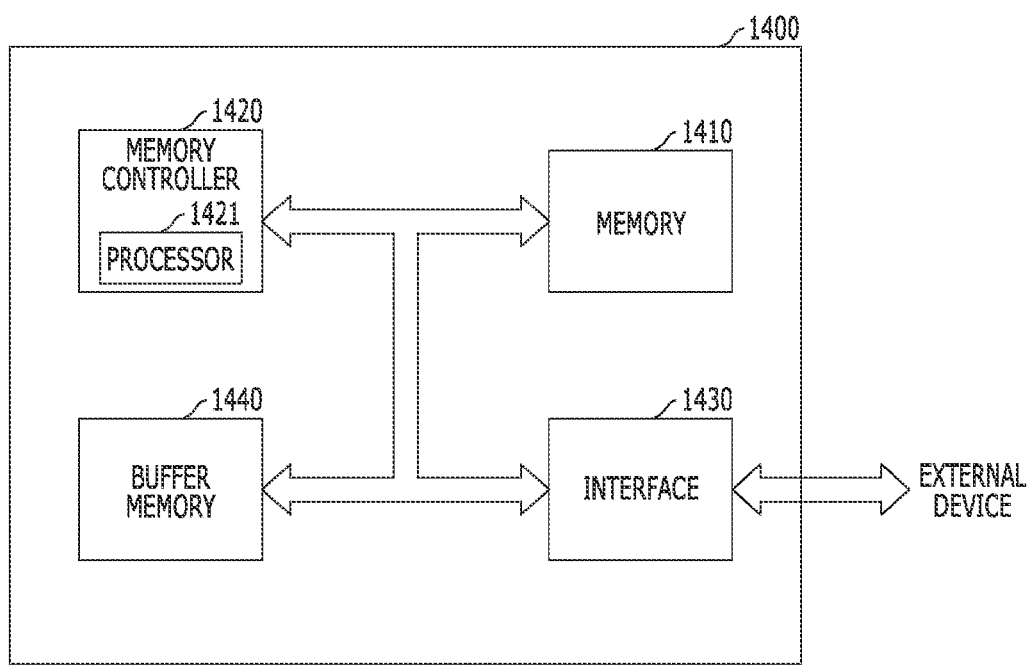
FIG. 18 is an example of configuration diagram of a memory system implementing memory circuitry based on the disclosed technology.

FIG. 18 is an example of configuration diagram of a memory system implementing memory circuitry based on the disclosed technology.

Referring to FIG. 18, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a substrate configured to include a plurality of active regions which are defined by isolation layers extending in a first direction and word lines extending in a second direction intersecting the first direction; source line contacts configured to be alternately disposed over the active regions arranged in the first and second directions and disposed over each of the active regions arranged in a third direction intersecting the first and second directions; source lines configured to extend in the third direction while being coupled to the source line contacts; contacts configured to be disposed over each of the active regions over which the source line contacts are not disposed; variable resistance elements configured to be disposed over each of the contacts; bit line contacts configured to be disposed over each of the variable resistance elements; and bit lines configured to extend in a fourth direction intersecting the first to third directions while being coupled to the bit line contacts. Through this, the level of integration and reliability of the memory 1410 can increase. As a consequence, the memory system 1400 has higher level of integration and improved reliability.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a substrate configured to include a plurality of active regions which are defined by isolation layers extending in a first direction and word lines extending in a second direction intersecting the first direction; source line contacts configured to be alternately disposed over the active regions arranged in the first and second directions and disposed over each of the active regions arranged in a third direction intersecting the first and second directions; source lines configured to extend in the third direction while being coupled to the source line contacts; contacts configured to be disposed over each of the active regions over which the source line contacts are not disposed; variable resistance elements configured to be disposed over each of the contacts; bit line contacts configured to be disposed over each of the variable resistance elements; and bit lines configured to extend in a fourth direction intersecting the first to third directions while being coupled to the bit line contacts. Through this, increasing integration and improving reliability of the buffer memory 1440 may be possible. As a consequence, increasing integration and improving reliability of the memory system 1400 may be possible.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 14-18 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities. While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device including a semiconductor memory, wherein the semiconductor memory includes:
   a substrate including a plurality of active regions which are defined by isolation layers extending in a first direction and word lines extending in a second direction intersecting the first direction;
   source line contacts disposed over every other of the active regions arranged in the first and second directions and disposed over each of the active regions arranged in a third direction intersecting the first and second directions;
   source lines extending in the third direction and being coupled to the source line contacts;
   contacts disposed over the active regions over which the source line contacts are not disposed;
   variable resistance elements disposed over and coupled to the contacts, respectively;
   bit line contacts disposed over and coupled to the variable resistance elements, respectively; and
   bit lines extending in a fourth direction intersecting the first to third directions and be coupled to the bit line contacts.

2. The electronic device of claim 1, wherein the word line is buried in the substrate.

3. The electronic device of claim 1, wherein a height of each of the source lines is equal to or less than that of each of the contacts.

4. The electronic device of claim 1, wherein the contacts include groups of contacts formed at different heights from the substrate and in the fourth direction.

5. The electronic device of claim 4, wherein the bit line contacts include groups of bit line contacts which overlap the groups of contacts, respectively, and upper heights of the groups of bit line contacts are the same.

6. The electronic device of claim 1, wherein the first direction and the second direction are substantially perpendicular to each other,
   the third direction and the fourth direction are substantially perpendicular to each other, and
   an angle formed by one of the first and second directions and one of the third and fourth directions is approximately 45°.

7. An electronic device including a semiconductor memory, wherein the semiconductor memory includes:
   a substrate including a plurality of active regions which are defined by isolation layers extending in a first direction and word lines extending in a second direction intersecting the first direction;
   source line contacts disposed over the active regions and between a pair of word lines located on two sides of a source line contact;
   source lines coupled to the source line contacts and extend in the second direction;
   contacts disposed over the active regions and between two adjacent word lines of two different pairs of word lines;
   variable resistance elements disposed over, and coupled to, the contacts, respectively;
   bit line contacts disposed over and coupled to the variable resistance elements, respectively; and
   bit lines disposed over and coupled to the bit line contacts and extend in the first direction.

8. The electronic device of claim 7, wherein the word line is buried in the substrate.

9. The electronic device of claim 8, wherein a height of each of the source lines is equal to or less than that of each of the contacts.

10. The electronic device of claim 8, wherein the contacts include groups of contacts formed at different heights in the second direction.

11. The electronic device of claim 10, wherein the bit line contacts include groups of bit line contacts which overlap the groups of contacts, respectively, and upper heights of the groups of bit lines are the same.

12. The electronic device according to claim 1, further comprising a processor which includes:
- a core unit configured to perform, based on a command inputted from an outside of the processor, an operation corresponding to the command, by using data;
- a cache memory unit configured to store data for performing the operation, data corresponding to a result of performing the operation, or an address of data for which the operation is performed; and
- a bus interface connected between the core unit and the cache memory unit, and configured to transmit data between the core unit and the cache memory unit,
- wherein the semiconductor memory is part of the cache memory unit in the processor.

13. The electronic device according to claim 1, further comprising a processing system which includes:
- a processor configured to decode a command received by the processor and control an operation for information based on a result of decoding the command;
- an auxiliary memory device configured to store a program for decoding the command and the information;
- a main memory device configured to call and store the program and the information from the auxiliary memory device such that the processor can perform the operation using the program and the information when executing the program; and
- an interface device configured to perform communication between at least one of the processor, the auxiliary memory device and the main memory device and the outside,
- wherein the semiconductor memory is part of the auxiliary memory device or the main memory device in the processing system.

14. The electronic device according to claim 1, further comprising a data storage system which includes:
- a storage device configured to store data and conserve stored data regardless of power supply;
- a controller configured to control input and output of data to and from the storage device according to a command inputted form an outside;
- a temporary storage device configured to temporarily store data exchanged between the storage device and the outside; and
- an interface configured to perform communication between at least one of the storage device, the controller and the temporary storage device and the outside,
- wherein the semiconductor memory is part of the storage device or the temporary storage device in the data storage system.

15. An electronic device including a semiconductor memory, wherein the semiconductor memory includes:
- a substrate patterned to include isolation layers and active regions separated by the isolation layers;
- word lines cross the active regions;
- first contacts formed over the active regions;
- source lines coupled to the first contacts;
- second contacts formed over the active regions and separated from the first contacts;
- variable resistance elements coupled to the second contacts;
- third contacts coupled to the variable resistance elements; and
- bit lines coupled to the third contacts,
- wherein the word lines, the source lines, the variable resistance elements and the bit lines are formed at different heights from one another, and the first contacts and the second contacts are alternately arranged in a first direction or a second direction.

16. The electronic device of claim 15, wherein the first contacts and the second contacts are formed in different portions of the active regions that do not overlap from one another.

17. The electronic device of claim 15, wherein the first direction and the second direction are parallel or intersect to each other.

18. The electronic device of claim 15, wherein the isolation layers, word lines, source lines, and bit lines intersect.

19. The electronic device of claim 15, wherein the variable resistance elements include groups of variable resistance elements, each group having different heights from other groups of variable resistance elements.

20. The electronic device of claim 19, wherein the second contacts include groups of second contacts, each group of second contacts having different height from other groups of second contacts.

* * * * *